United States Patent
Kang et al.

(10) Patent No.: US 9,966,424 B2
(45) Date of Patent: May 8, 2018

(54) ORGANIC LIGHT EMITTING DIODE DISPLAY DEVICE

(71) Applicant: Samsung Display Co., Ltd, Yongin-si, Gyeonggi-do (KR)

(72) Inventors: Ki-Nyeng Kang, Seoul (KR); Jong-Hyun Choi, Seoul (KR); Sun-Kwang Kim, Suwon-si (KR)

(73) Assignee: Samsung Display Co., Ltd. (KR)

( * ) Notice: Subject to any disclaimer, the term of this patent is extended or adjusted under 35 U.S.C. 154(b) by 0 days. days.

(21) Appl. No.: 15/219,661

(22) Filed: Jul. 26, 2016

(65) Prior Publication Data

US 2017/0207288 A1    Jul. 20, 2017

(30) Foreign Application Priority Data

Jan. 15, 2016    (KR) .................. 10-2016-0005165

(51) Int. Cl.
*H01L 27/32*    (2006.01)

(52) U.S. Cl.
CPC ...... *H01L 27/3276* (2013.01); *H01L 27/3206* (2013.01); *H01L 27/3211* (2013.01); *H01L 27/3213* (2013.01); *H01L 27/3216* (2013.01); *H01L 2227/323* (2013.01); *H01L 2251/5323* (2013.01)

(58) Field of Classification Search
CPC ............. H01L 27/3211; H01L 27/3248; H01L 27/3246; H01L 27/3279; H01L 51/56; H01L 27/28; H01L 27/32; H01L 27/3206; H01L 27/3209; H01L 27/3213; H01L 27/3216; H01L 27/3218; H01L 27/3276; H01L 27/3288; H01L 27/3297; H01L 2227/323; H01L 2251/5323
See application file for complete search history.

(56) References Cited

U.S. PATENT DOCUMENTS

| | | | |
|---|---|---|---|
| 2011/0147770 A1* | 6/2011 | Hwang | ................. H01L 27/326 257/89 |
| 2011/0260204 A1* | 10/2011 | Akagawa | ............ H01L 27/3246 257/99 |
| 2015/0014650 A1 | 1/2015 | Lim et al. | |

* cited by examiner

*Primary Examiner* — Thanh T Nguyen
(74) *Attorney, Agent, or Firm* — Innovation Counsel LLP

(57) ABSTRACT

An organic light emitting diode display device includes a substrate, a pixel structure, and a wiring pattern. The substrate includes a plurality of pixel regions each having sub-pixel regions and a transparent region. The pixel structure is disposed in the sub-pixel region on the substrate. The wiring pattern is disposed in the transparent region and the sub-pixel region on the substrate, and is electrically connected to the pixel structure. The wiring pattern extends in a first direction that is from the transparent region into the sub-pixel region, and has at least one opening in the transparent region.

19 Claims, 15 Drawing Sheets

FIG. 2
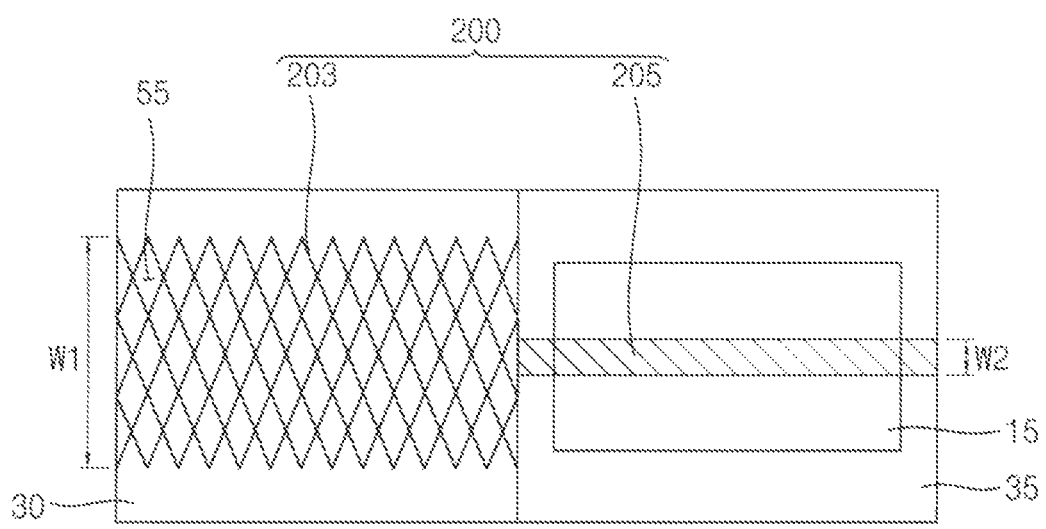
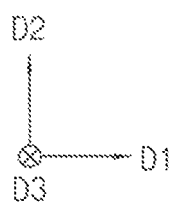

FIG. 16
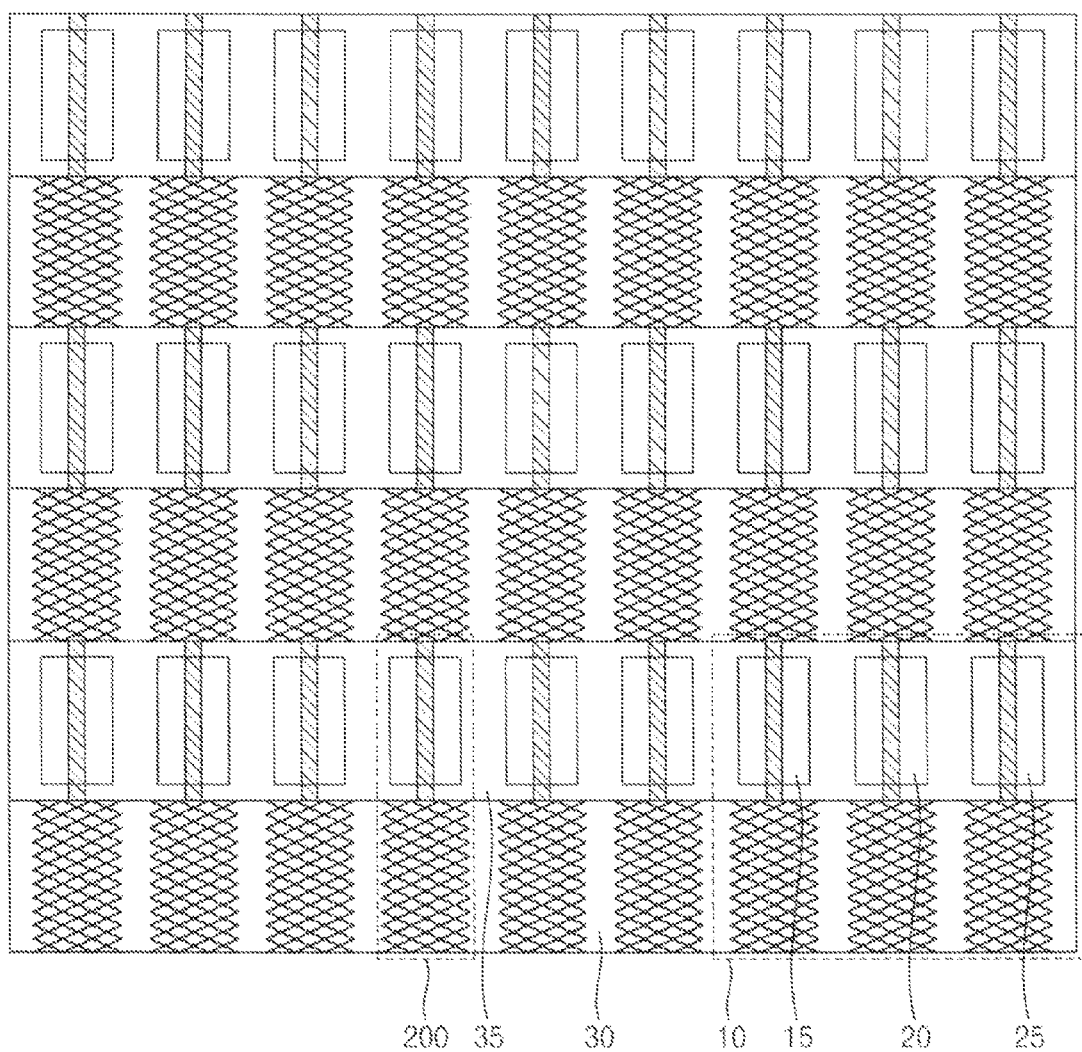
200 35 30 10 15 20 25
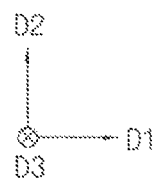

ORGANIC LIGHT EMITTING DIODE DISPLAY DEVICE

CROSS-REFERENCE TO RELATED APPLICATION(S)

This application claims priority under 35 USC § 119 to Korean Patent Applications No. 10-2016-0005165, filed on Jan. 15, 2016 in the Korean Intellectual Property Office (KIPO), the contents of which are incorporated herein in its entirety by reference.

BACKGROUND

1. Field

Example embodiments relate generally to organic light emitting diode display devices. More particularly, embodiments of the present inventive concept relate to organic light emitting diode display devices including a transparent region.

2. Description of the Related Art

A flat panel display (FPD) device is widely used as a display device of an electronic device because the FPD device is lightweight and thin compared to a cathode-ray tube (CRT) display device. Typical examples of the FPD device are a liquid crystal display (LCD) device and an organic light emitting diode (OLED) display device. Compared to the LCD device, the OLED display device has many advantages such as a higher luminance and a wider viewing angle. In addition, the OLED display device can be made thinner because the OLED display device does not require a backlight. In the OLED display device, electrons and holes are injected into an organic thin layer through a cathode and an anode, and then recombined in the organic thin layer to generate excitons, thereby a light of a certain wavelength can be emitted.

Recently, a transparent OLED display device capable of transmitting an image of an object (or a target) that is located in the rear (e.g., the back) of the OLED display device by including a sub-pixel region and a transparent region has been developed. Here, opaque metal wirings capable of reducing a transmissivity of the transparent OLED display device are not disposed in the transparent region of the transparent OLED display device. For example, the metal wiring (e.g., a power supply voltage wiring, a scan signal wiring, a data signal wiring, an emission signal wiring, etc) may be disposed in a portion that surrounds the transparent region, and the portion surrounding the transparent region may be opaque. In this case, a diffraction phenomenon of a light may be generated due to the portion surrounding the transparent region, and a visibility of the transparent OLED display device may be reduced.

SUMMARY

Some example embodiments provide an organic light emitting diode display device capable of reducing a diffraction phenomenon of a light.

According to some aspect of example embodiments, an organic light emitting diode (OLED) display device includes a substrate, a pixel structure, and a wiring pattern. The substrate includes a plurality of pixel regions each having sub-pixel regions and a transparent region. The pixel structure is disposed in the sub-pixel region on the substrate. The wiring pattern is disposed in the transparent region and the sub-pixel region on the substrate, and is electrically connected to the pixel structure. The wiring pattern extends in a first direction that is from the transparent region into the sub-pixel region, and has at least one opening in the transparent region.

In example embodiments, the wiring pattern may have a first width in the transparent region and a second width in the sub-pixel region that is less than the first width.

In example embodiments, the pixel regions may be arranged on the entire substrate in the first direction and a second direction that is perpendicular to the first direction. The transparent region included in the pixel regions arranged in the second direction among the pixel regions may extend in the second direction on the substrate, and may have a planar shape of a bar extending in the second direction.

In example embodiments, the pixel regions may be arranged on the entire substrate in the first direction and a second direction that is perpendicular to the first direction. The pixel regions arranged in the second direction among the pixel regions may be corresponding to one transparent region.

In example embodiments, the pixel regions may be arranged on the entire substrate in the first direction and a second direction that is perpendicular to the first direction. The wiring pattern may be disposed in the pixel regions arranged in the first direction among the pixel regions.

In example embodiments, the wiring pattern may have a plurality of openings in the transparent region, and may be spatially divided by the openings.

In example embodiments, the openings may be regularly arranged.

In example embodiments, the openings may be irregularly arranged.

In example embodiments, a shape of the openings each may have a planar shape of a tetragonal opening, a triangle opening, a diamond opening, a polygonal opening, a circular opening, an athletic track opening, or an elliptical opening.

In example embodiments, the substrate further includes an opaque region surrounding the sub-pixel region. The opaque region may not overlap the sub-pixel region and the transparent region.

In example embodiments, the OLED display device may further include a pixel defining layer. The pixel defining layer may be in the opaque region, and may expose the sub-pixel regions and the transparent region. The pixel defining layer may surround the sub-pixel region, and may extend in a second direction that is perpendicular to the first direction. The pixel defining layer may have a planar shape of a bar extending in the second direction.

In example embodiments, the wiring pattern includes a first wiring extension and a second wiring extension. The first wiring extension may extend along the first direction in the transparent region, and may have a mesh structure including a plurality of openings. The second wiring extension may extend along the first direction in the sub-pixel region and the opaque region.

In example embodiments, the first and second wiring extensions may be integrally formed.

In example embodiments, the wiring pattern may further include a third wiring extension. The third wiring extension may be interposed between the first and second wiring extensions, and may extend along the first direction in the opaque region. The third wiring extension may have a width that is greater than a width of a second wiring extension.

In example embodiments, a first side of the third wiring extension may be in contact with the first wiring extension, and a second side of the third wiring extension may be in contact with the second wiring extension. The first, second, and third wiring extensions may be integrally formed.

In example embodiments, the pixel defining layer may have an opaque color, and the third wiring extension may be disposed under the pixel defining layer.

In example embodiments, the OLED display device may further include a semiconductor element. The semiconductor element may be disposed in the sub-pixel region on the substrate, and may be electrically connected to the pixel structure. The semiconductor element may include an active layer, a gate electrode, a conductive pattern, a source electrode, and a drain electrode. The active layer may be disposed on the substrate, and may includes source and drain regions. The gate electrode may be disposed on the active layer. The conductive pattern may be disposed on the gate electrode. The source electrode may be disposed on the conductive pattern, and may be in contact with the source region of the active layer. The drain electrode may be spaced apart from the source electrode, and may be in contact with the drain region of the active layer.

In example embodiments, the wiring pattern and the conductive pattern may be located at the same level, and may be simultaneously formed using the same materials.

In example embodiments, the OLED display device may further include a third wiring extension. The third wiring extension may extend along the first direction in the opaque region, and may have a width that is greater than a width of a second wiring extension. The first wiring extension disposed in the transparent region and the third wiring extension disposed in the opaque region may be integrally formed, and the first and third wiring extensions may be disposed on the second wiring extension disposed in the sub-pixel region.

In example embodiments, the third wiring extension may overlap at least a portion of the second wiring extension, and may be in contact with the second wiring extension through a contact hole located in the overlapped portion.

As an OLED display device according to example embodiments includes a wiring pattern, the OLED display device may reduce a diffraction phenomenon of a light transmitting the transparent region. Accordingly, a visibility of the OLED display device may be improved.

BRIEF DESCRIPTION OF THE DRAWINGS

Example embodiments can be understood in more detail from the following description taken in conjunction with the accompanying drawings, in which:

FIG. 2 is a planar view for describing a wiring pattern included in the OLED display device of FIG. 1;

FIG. 16 is a planar view illustrating the OLED display device in accordance with example embodiments.

DETAILED DESCRIPTION OF THE EMBODIMENTS

Hereinafter, embodiments of the present inventive concept will be explained in detail with reference to the accompanying drawings.

Figure 1:
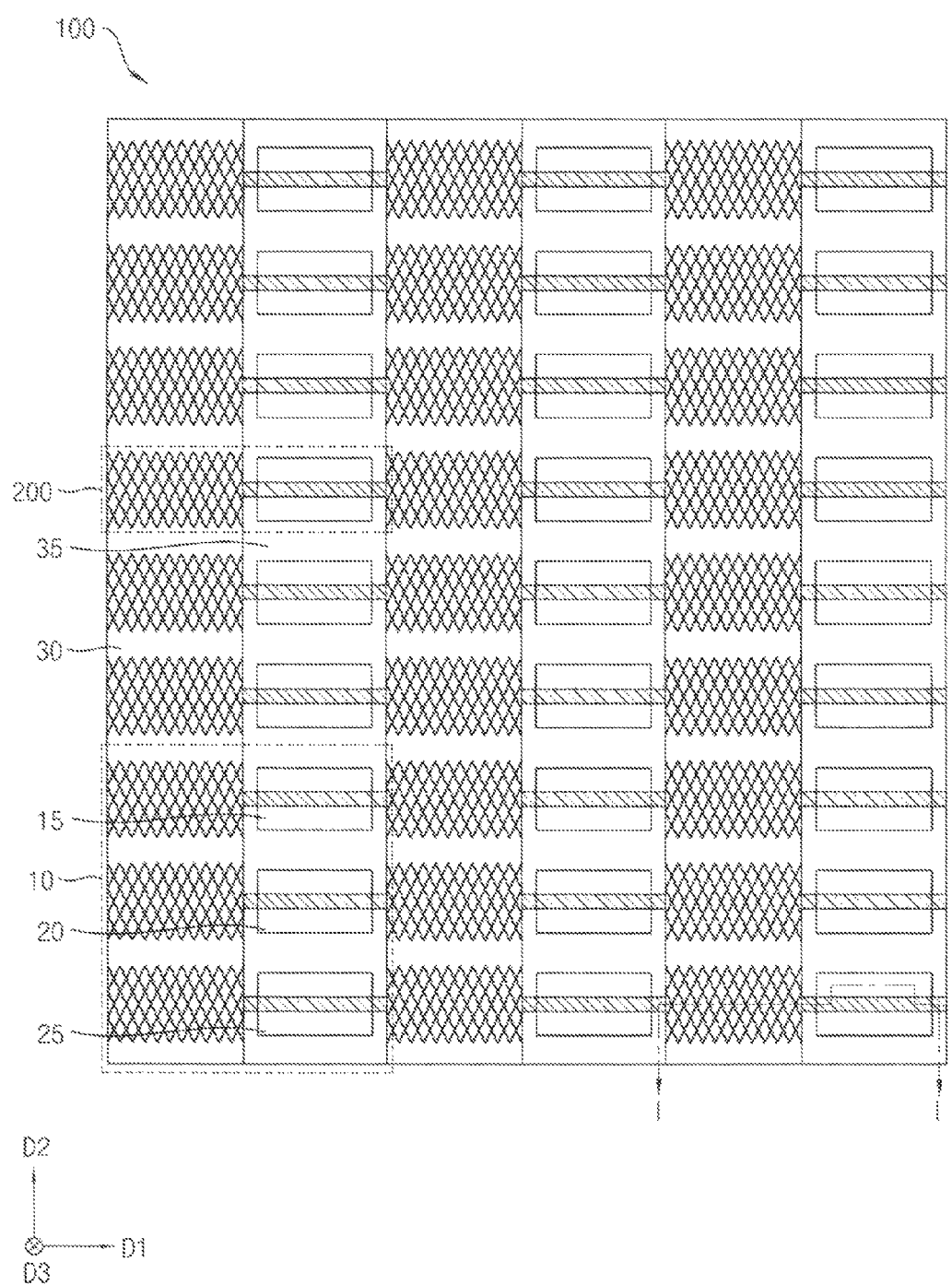
FIG. 1 is a planar view illustrating an organic light emitting diode (OLED) display device in accordance with example embodiments.

FIG. 1 is a planar view illustrating an organic light emitting diode (OLED) display device 100 in accordance with example embodiments.

Referring to FIG. 1, the organic light emitting diode (OLED) display device 100 may include a plurality of pixel regions 10. One pixel region 10 among a plurality of pixel regions may include first, second, and third sub-pixel regions 15, 20, and 25, a portion of a transparent region 30, and a portion of an opaque region 35. For example, the pixel regions 10 may be arranged in first and second directions D1 and D2 on the entire substrate, which will be described below, included in the OLED display device 100. Here, the first direction D1 (e.g., a direction from the transparent region 30 into sub-pixel region) is parallel to an upper surface of the substrate, and the second direction D2 is perpendicular to the first direction D1. In example embodiments, the transparent region 30 included in the pixel regions 10 arranged in the second direction D2 among the pixel regions 10 may extend in the second direction D2 on the substrate, and may have a planar shape of a bar extending in the second direction D2. For example, the pixel regions 10 arranged in the second direction D2 among the pixel regions 10 may be corresponding to one transparent region 30.

In addition, the opaque region 35 may surround the first, second, and third sub-pixel regions 15, 20, and 25, and may extend in the second direction D2. For example, the first, second, and third sub-pixel regions 15, 20, and 25 repeatedly arranged in the second direction D2 among the first, second, and third sub-pixel regions 15, 20, and 25 may be corresponding to one opaque region 35, and the opaque region 35 may not overlap the first, second, and third sub-pixel regions 15, 20, and 25 and the transparent region 30.

First, second, and third sub-pixels may be disposed in the first, second, and third sub-pixel regions 15, 20, and 25, respectively. For example, the first sub-pixel may emit a red color of a light, and the second sub-pixel may emit a green color of a light. In addition, the third sub-pixel may emit a blue color of a light. The first, second, and third sub-pixels may be disposed at the same level on the substrate.

In the transparent region 30, a light incident from the outside may be transmitted via the transparent region 30.

In the opaque region 35, a pixel defining layer, which will be described below, included in the OLED display device 100 may be disposed. For example, the first, second, and third sub-pixel regions 15, 20, and 25 may be substantially surrounded by the pixel defining layer. That is, the first, second, and third sub-pixel regions 15, 20, and 25 may be defined by the pixel defining layer, and the pixel defining layer may expose the first, second, and third sub-pixel regions 15, 20, and 25 and the transparent region 30. The pixel defining layer may surround the first, second, and third sub-pixel regions 15, 20, and 25, and may extend in the second direction D2. In addition, the pixel defining layer may have a planar shape of a bar extending in the second direction D2. In other word, the pixel defining layer may be disposed in a portion except the first, second, and third sub-pixel regions 15, 20, and 25 and the transparent region 30. Alternatively, the pixel defining layer may expose the first, second, and third sub-pixel regions 15, 20, and 25, and may be disposed in the transparent region 30.

In example embodiments, a wiring pattern 200 may continuously extend in the pixel regions along a first direction. The wiring pattern 200 may be disposed in the first, second, and third sub-pixel regions 15, 20, and 25, the transparent region 30, and the opaque region 35 on the substrate. For example, the wiring pattern 200 may be disposed in the pixel regions 10 arranged in the first direction D1 among the pixel regions 10. In other word, the wiring pattern 200 may extend in the first direction D1 on the substrate. In addition, the wiring pattern 200 may have a first width in the transparent region 30, and may have a second width in the first, second, and third sub-pixel regions 15, 20, and 25 and the opaque region 35. Here, the second width may be less than the first width.

The wiring pattern 200 may be metal or conductive wirings (e.g., a power supply voltage wiring, a scan signal wiring, a data signal wiring, an emission signal wiring, etc). For example, the wiring pattern 200 may be the emission signal wiring, and may provide the emission signal to at least one semiconductor element, which will be described below, included in the OLED display device 100. Compared to a conventional OLED display device, the conductive wirings included in the conventional OLED display device may be disposed under the pixel defining layer surrounding the transparent region 30, and a portion surrounding the transparent region 30 may be opaque because the conductive wirings are opaque. Thus, a diffraction phenomenon of a light transmitting the transparent region 30 may be generated in the conventional OLED display device due to the opaque portion. That is, the conductive wirings may have a mesh (or a lattice) structure including a plurality of slits (e.g., openings) in the pixel regions 10. Here, when an external light incident from the outside passes through the slits, the light is diffracted. As the OLED display device 100 in accordance with example embodiments includes the wiring pattern 200, the opaque portion surrounding the transparent region 30 (e.g., an opaque portion perforating the transparent region 30 in the first direction D1) may be removed. Accordingly, a visibility of the OLED display device 100 may be improved. In addition, the wiring pattern 200 may have at least one opening in the transparent region 30, and a light incident from the outside may be transmitted via the opening. For example, although the wiring pattern 200 is disposed in the transparent region 30, an image of an object that is located at the back of the OLED display device 100 may be transmitted via the opening. Accordingly, the OLED display device 100 may serve as a transparent OLED display device.

In example embodiments, three wiring patterns 200 may be disposed in one pixel region 10, but not being limited thereto.

FIG. 2 is a planar view for describing the wiring pattern 200 included in the OLED display device of FIG. 1.

Referring to FIGS. 1 and 2, the wiring pattern 200 may be disposed in the first sub-pixel region 15, the transparent region 30, and the opaque region 35 on a substrate. The wiring pattern 200 may extend in the first direction D1 on the substrate. The wiring pattern 200 may have a first width W1 in the transparent region 30, and the first width W1 may be a predetermined width extending in a second direction D2. The wiring pattern 200 may have a second width W2 in the first sub-pixel region 15 and the opaque region 35, and the second width W2 may be a predetermined width extending in the second direction D2. In addition, the second width W2 may be less than the first width W1. In example embodiments, the wiring pattern 200 may include a first wiring extension 203 and a second wiring extension 205. The first wiring extension 203 may have the first width W1, and may be located in the transparent region 30. The second wiring extension 205 may have the second width W2, and may be located in the first sub-pixel region 15 and the opaque region 35. The first wiring extension 203 may have a mesh structure including a plurality of openings 55, and the second wiring extension 205 may have a planar shape of a bar extending in the first direction D1. The first wiring extension 203 and the second wiring extension 205 may be integrally formed. In other word, the wiring pattern 200 may be spatially divided by the openings 55 in the transparent region 30. In example embodiments, the first wiring extension 203 may have a structure that a wiring of a substantially X shape is repeatedly disposed in the first and second directions D1 and D2. The mesh structure (e.g., a width of lines each constituting the first wiring extension 203) surrounding the openings 55 may be formed below about 2.0 micrometers such that the mesh structure is not observed (e.g., recognized) by a user of the OLED display device. The openings 55 may be regularly arranged in the transparent region 30. A shape of the openings 55 each may have a planar shape of a diamond opening. Alternatively, a shape of the openings 55 each may have a planar shape of a tetragonal opening, a triangle opening, a polygonal opening, a circular opening, an athletic track opening, or an elliptical opening. The first wiring extension 203 and the second wiring extension 205 may be simultaneously formed using the same materials. Alternatively, the openings 55 may be irregularly arranged. In example embodiments, the wiring pattern 200 may be disposed in the transparent region 30, the first sub-pixel region 15, and the opaque region 35 on the substrate. Alternatively, the second wiring extension 205 may be only disposed in the opaque region 35.

Figure 3A:
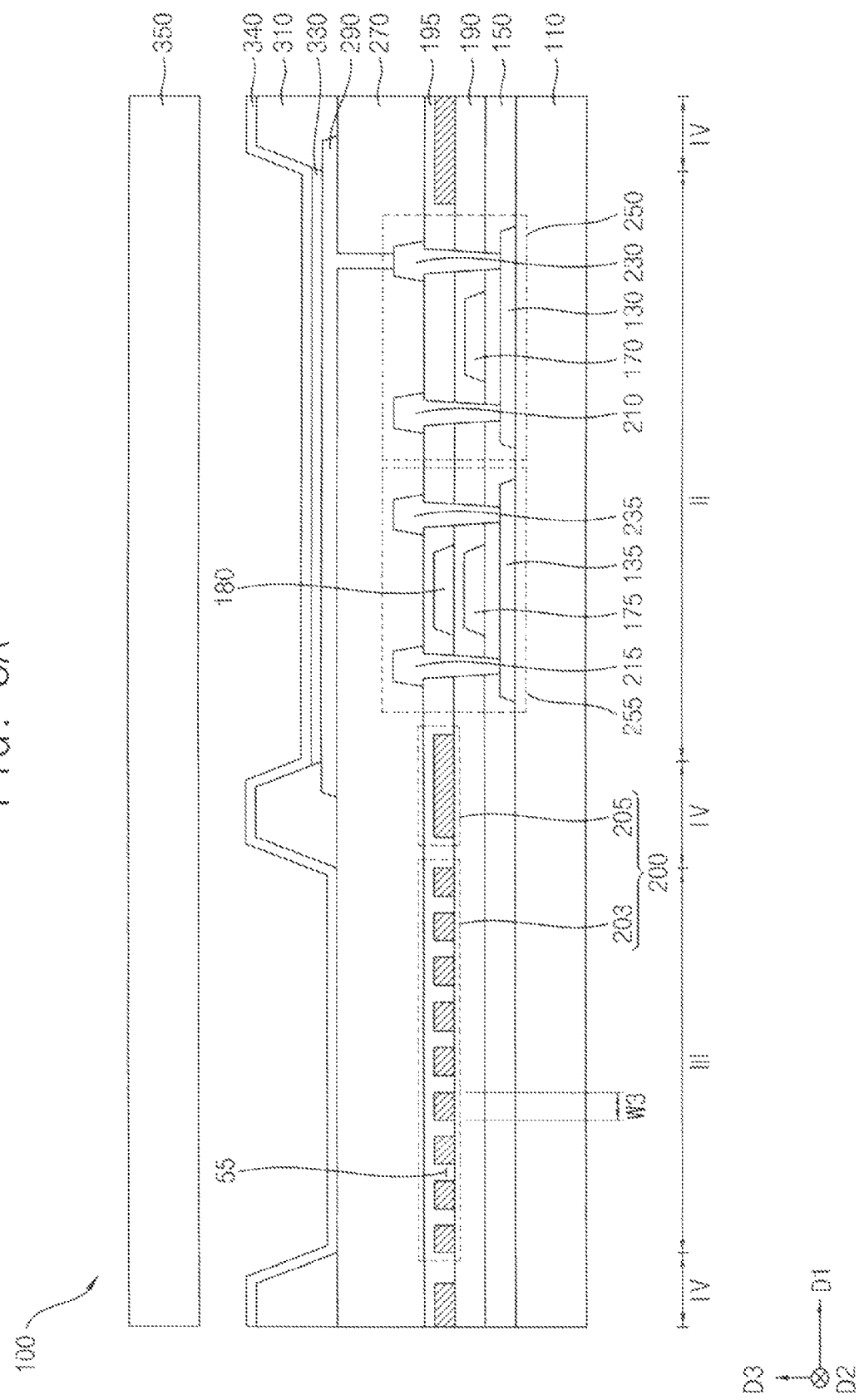
FIG. 3A is a cross-sectional view taken along a line I-I' of FIG. 1.
Figure 3B:
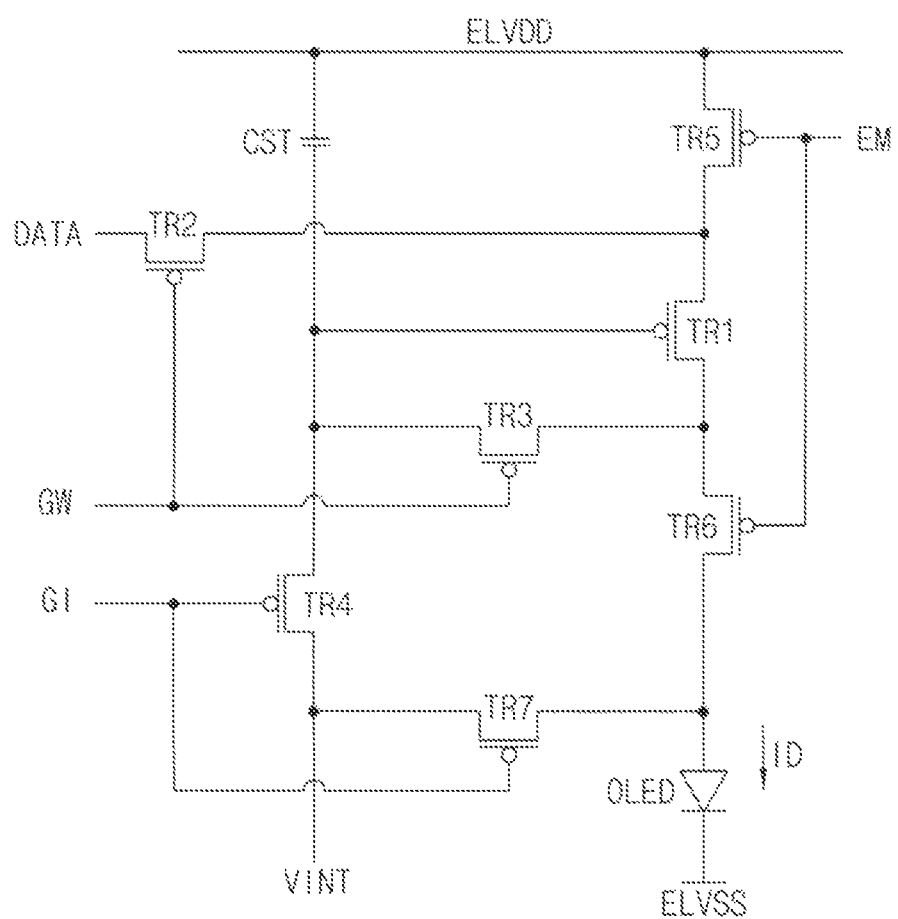
FIG. 3B is a circuit diagram for describing an OLED and transistors included in the OLED display device of FIG. 1.

FIG. 3A is a cross-sectional view taken along a line I-I' of FIG. 1, and FIG. 3B is circuit diagram for describing an organic light emitting diode and transistors included in the OLED display device 100 of FIG. 1.

Referring to FIGS. 3A and 3B, the OLED display device 100 may include a substrate 110, a planarization layer 270, a first semiconductor element 250, a second semiconductor element 255, the wiring pattern 200, a pixel structure, a pixel defining layer 310, an encapsulation substrate 350, etc. Here, the pixel structure may include a lower electrode 290, a light emitting layer 330, and an upper electrode 340, and the first semiconductor element 250 may include a first active layer 130, a first gate electrode 170, a first source electrode 210, a first drain electrode 230, a gate insulation layer 150, a first insulating interlayer 190, and a second insulating interlayer 195. In addition, the second semiconductor element 255 may include a second active layer 135, a second gate electrode 175, a conductive pattern 180, a second source electrode 215, a second drain electrode 235, the gate insulation layer 150, the first insulating interlayer 190, and the second insulating interlayer 195.

As described above, the OLED display device 100 may include a plurality of pixel regions. One pixel region among a plurality of pixel regions may include a sub-pixel region II, a transparent region III, and an opaque region IV. The first semiconductor element 250, the second semiconductor element 255, the lower electrode 290, and the light emitting layer 330 may be disposed in the sub-pixel region II, and the pixel defining layer 310 may be disposed in the opaque region IV. The upper electrode 340 may be disposed in the sub-pixel region II, the transparent region III, and the opaque region IV. In example embodiments, the wiring pattern 200 may be disposed in the transparent region III, the opaque region IV, and the sub-pixel region II. The wiring pattern 200 may be electrically connected to the first semiconductor element 250 and/or the second semiconductor element 255.

For example, a display image may be displayed in the sub-pixel regions II, and an image of an object that is located in the back of the OLED display device 100 may be transmitted in the transparent region III. As the OLED display device 100 includes the wiring pattern 200, the OLED display device 100 may serve as a transparent OLED display device that a visibility is improved.

The first semiconductor element 250, the second semiconductor element 255, the pixel structure, and the wiring pattern 200 may be disposed on the substrate 110. The substrate 110 may be formed of transparent materials or opaque materials. For example, the substrate 110 may include a quartz substrate, a synthetic quartz substrate, a calcium fluoride substrate, a fluoride-doping quartz substrate, a sodalime substrate, a non-alkali substrate etc. Alternatively, the substrate 110 may be formed of a flexible transparent material such as a flexible transparent resin substrate (e.g., a polyimide substrate). For example, the polyimide substrate may include a first polyimide layer, a barrier film layer, a second polyimide layer, etc. Since the polyimide substrate is relatively thin and flexible, the polyimide substrate may be disposed on a rigid glass substrate to help support the formation of the first and second semiconductor elements 250 and 255 and the pixel structure. That is, the substrate 110 may have a structure in which the first polyimide layer, the barrier film layer and the second polyimide layer are stacked on the rigid glass substrate. In a manufacturing of the OLED display device 100, after an insulating layer (e.g., a buffer layer) is provided on the second polyimide layer of the polyimide substrate, the first and second semiconductor elements 250 and 255 and the pixel structure may be disposed on the insulating layer. After the first and second semiconductor elements 250 and 255 and the pixel structure are formed on the insulating layer, the rigid glass substrate under which the polyimide substrate is disposed may be removed. It may be difficult to directly form the first and second semiconductor elements 250 and 255 and the pixel structure on the polyimide substrate because the polyimide substrate is relatively thin and flexible. Accordingly, the first and second semiconductor elements 250 and 255 and the pixel structure are formed on the polyimide substrate and the rigid glass substrate, and then the polyimide substrate may serve as the substrate 110 of the OLED display device 100 after the removal of the rigid glass substrate. As OLED display device 100 includes the sub-pixel region II, the transparent region III, and the opaque region IV, the substrate 110 may also include the sub-pixel region II, the transparent region III, and the opaque region IV.

A buffer layer (not shown) may be disposed on the substrate 110. The buffer layer may be disposed on the entire substrate 110. The buffer layer may prevent the diffusion of metal atoms and/or impurities from the substrate 110 into the first and second semiconductor elements 250 and 255. Additionally, the buffer layer may control a rate of a heat transfer in a crystallization process for forming the first and second active layers 130 and 135, thereby obtaining a substantially uniform active layer. Furthermore, the buffer layer may improve a surface flatness of the substrate 110 when a surface of the substrate 110 is relatively uneven. According to a type of the substrate 110, at least two buffer layers may be provided on the substrate 110, or the buffer layer may not be disposed. For example, the buffer layer may include organic materials or inorganic materials. In example embodiments, the buffer layer may include silicon oxide (SiOx), silicon nitride (SiNx), silicon oxynitride (SiOxNy), etc.

Each of the first and second semiconductor elements 250 and 255 may be formed of the first and second active layers 130 and 135, the first and second gate electrodes 170 and 175, the first and second source electrodes 210 and 215, and the first and second drain electrodes 230 and 235, respectively, the gate insulation layer 150, the first insulating interlayer 190, and the second insulating interlayer 195. Here, the second semiconductor element 255 may further include the conductive pattern 180. For example, the first and second active layers 130 and 135 may be spaced apart from each other by a predetermined distance, and may be formed of an oxide semiconductor, an inorganic semiconductor (e.g., amorphous silicon, polysilicon, etc.), an organic semiconductor, etc.

The gate insulation layer 150 may be disposed on the first and second active layers 130 and 135. The gate insulation layer 150 may cover the first and second active layers 130 and 135 in the sub-pixel region II and the opaque region IV, and may extend in a first direction D1 on the substrate 110. Here, the first direction D1 is from the transparent region III into the sub-pixel region II. That is, the gate insulation layer 150 may be disposed on the entire substrate 110. In example embodiments, the gate insulation layer 150 may sufficiently cover the first and second active layers 130 and 135, and may have a substantially even surface without a step around the first and second active layers 130 and 135. Alternatively, the gate insulation layer 150 may cover the first and second active layers 130 and 135, and may be disposed as a substantially uniform thickness along a profile of the first and second active layers 130 and 135. The gate insulation layer 150 may be formed of a silicon compound, a metal oxide, etc. For example, the gate insulation layer 150 may include SiOx, SiNx, SiOxNy, silicon oxycarbide (SiOxCy), silicon carbon nitride (SiCxNy), aluminum oxide (AlOx), aluminum nitride (AlNx), tantalum oxide (TaOx), hafnium oxide (HfOx), zirconium oxide (ZrOx), titanium oxide (TiOx), etc. In example embodiments, the gate insulation layer 150 may include inorganic materials.

Each of the first and second gate electrodes 170 and 175 may be disposed on a portion of the gate insulation layer 150 under which each of the first and second active layers 130 and 135 is disposed to overlap the first and second active layers 130 and 135 in a plan view. Each of the first and second gate electrodes 170 and 175 may be formed of a metal, a metal alloy, a metal nitride, a conductive metal oxide, transparent conductive materials, etc.

The first insulating interlayer 190 may be disposed on the first and second gate electrodes 170 and 175. The first insulating interlayer 190 may cover the first and second gate electrodes 170 and 175 in the sub-pixel region II and the opaque region IV, and may extend in the first direction D1 on the gate insulation layer 150. That is, the first insulating interlayer 190 may be disposed on the entire gate insulation layer 150. In example embodiments, the first insulating interlayer 190 may sufficiently cover the first and second gate electrodes 170 and 175, and may have a substantially even surface without a step around the first and second gate electrodes 170 and 175. Alternatively, the first insulating interlayer 190 may cover the first and second gate electrodes 170 and 175, and may be disposed as a substantially uniform thickness along a profile of the first and second gate electrodes 170 and 175. The first insulating interlayer 190 may include a silicon compound, a metal oxide, etc.

The conductive pattern 180 and the wiring pattern 200 may be disposed on the first insulating interlayer 190. The conductive pattern 180 may be disposed on a portion of the first insulating interlayer 190 under which the second gate electrode 175 is disposed to overlap the second gate electrode 175 in a plan view. Here, the second gate electrode 175 and the conductive pattern 180 may serve as a storage capacitor of the OLED display device 100. For example, the second gate electrode 175 may be a first electrode of the storage capacitor, and the conductive pattern 180 may be a second electrode of the storage capacitor.

The wiring pattern 200 may be disposed in the sub-pixel region II, the transparent region III, and the opaque region IV on the first insulating interlayer 190. In example embodiments, the wiring pattern 200 may include the first wiring extension 203 and the second wiring extension 205. As illustrated in FIG. 2, the first wiring extension 203 may have a first width W1, may be located in the transparent region III. The second wiring extension 205 may have a second width W2 that is less than the first width W1, and may be located in the opaque region IV and the sub-pixel region II. The first wiring extension 203 may include have a mesh structure including the plurality of openings 55, and the second wiring extension 205 may have a planar shape of a bar extending in the first direction D1. The first wiring extension 203 and the second wiring extension 205 may be electrically connected to each other, and may be integrally formed. The second wiring extension 205 may be disposed in the sub-pixel region II, and may be electrically connected to the first semiconductor element 250 and/or the second semiconductor element 255. Alternatively, the second wiring extension 205 may be only disposed in the opaque region IV.

In example embodiments, the wiring pattern 200 may be metal wirings (e.g., a power supply voltage wiring, a scan signal wiring, a data signal wiring, an emission signal wiring, etc).

For example, the OLED display device 100, as illustrated in FIG. 3B, may include an OLED (e.g., the pixel structure of FIG. 3A) and transistors (e.g., semiconductor elements of FIG. 3A).

The OLED may emit light based on a driving current ID. The OLED may include a first terminal and a second terminal. In example embodiments, the second terminal of the OLED receives a first power voltage ELVSS. For example, the first terminal of the OLED is an anode terminal, and the second terminal of the OLED is a cathode terminal. Alternatively, the first terminal of the OLED may be a cathode terminal, and the second terminal of the OLED may be an anode terminal.

A first transistor TR1 may include a gate terminal, a first terminal, and a second terminal. In example embodiments, the first terminal of the first transistor TR1 is a source terminal, and the second terminal of the first transistor TR1 is a drain terminal. Alternatively, the first terminal of the first transistor TR1 may be a drain terminal, and the second terminal of the first transistor TR1 may be a source terminal.

The driving current ID may be generated by the first transistor TR1. In example embodiments, the first transistor TR1 operates in a saturation region. In this case, the first transistor TR1 may generate the driving current ID based on a voltage difference of the gate terminal and the source terminal, and a gradation may be implemented based on an amount of the driving current ID generated by the first transistor TR1. In some example embodiments, the first transistor TR1 operates in a linear region. In this case, a gradation may be implemented based on the amount of time during which the first transistor TR1 provides the driving current ID to the OLED within one frame.

A second transistor TR2 may include a gate terminal, a first terminal, and a second terminal. A scan signal GW may be applied to the gate terminal of the second transistor TR2. The first terminal of the second transistor TR2 may receive a data signal DATA. The second terminal of the second transistor TR2 may be connected to the first terminal of the first transistor TR1. In example embodiments, the first terminal of the second transistor TR2 is a source terminal, and the second terminal of the second transistor TR2 is a drain terminal. In some example embodiments, the first terminal of the second transistor TR2 is a drain terminal, and the second terminal of the second transistor TR2 is a source terminal.

The second transistor TR2 may provide the data signal DATA to the first terminal of the first transistor TR1 while the scan signal GW is activated. The fourth transistor TR4 may operate in a linear region. In this case, the second transistor TR2 operates in a linear region.

A third transistor TR3 may include a gate terminal, a first terminal, and a second terminal. The gate terminals of the third transistor TR3 may receive the scan signal GW. The first terminal of the third transistor TR3 may be connected to the gate terminal of the first transistor TR1. The second terminal of the third transistor TR3 may be connected to the second terminal of the first transistor TR1. In example embodiments, the first terminal of the third transistor TR3 is a source terminal, and the second terminal of the third transistor TR3 is a drain terminal. Alternatively, the first terminal of the third transistor TR3 may be a drain terminal, and the second terminal of the third transistor TR3 may be a source terminal.

The third transistor TR3 may connect the gate terminal of the first transistor TR1 to the second terminal of the first transistor TR1 while the scan signal GW is activated. In this case, the third transistor TR3 may operate in a linear region. That is, the third transistor TR3 may form a diode connection of the first transistor TR1 while the scan signal GW is activated. A voltage difference between the first terminal of the first transistor TR1 and the gate terminal of the first transistor TR1, the voltage difference of which amount corresponds to a threshold voltage of the first transistor TR1, may occur due to the diode connection. As a result, a sum voltage of the data signal DATA provided to the first terminal of the first transistor TR1 and the voltage difference (i.e., the threshold voltage) may be applied to the gate terminal of the first transistor TR1 while the scan signal GW is activated. Thus, the data signal DATA may be compensated as much as the threshold voltage of the first transistor TR1. The compensated data signal DATA may be applied to the gate terminal of the first transistor TR1. A uniformity of the driving current ID may be improved because of reducing an affect by the threshold voltage of the first transistor TR1.

An input terminal of an initialization voltage VINT is connected to a first terminal of a fourth transistor TR4 and a first terminal of a seventh transistor TR7, and an output terminal of an initialization voltage VINT is connected to a second terminal of the fourth transistor TR4 and a first terminal of a storage capacitor CST.

The fourth transistor TR4 may include a gate terminal, the first terminal, and the second terminal. The gate terminal of the fourth transistor TR4 may receive a data initialization signal GI. The initialization voltage VINT may be applied to the first terminal of the fourth transistor TR4. The second terminal of the fourth transistor TR4 may be connected to the gate terminal of the first transistor TR1. In example embodiments, the first terminal of the fourth transistor TR4 is a source terminal, and the second terminal of the fourth transistor TR4 is a drain terminal. Alternatively, the first terminal of the fourth transistors TR4 may be a drain terminal, and the second terminal of the fourth transistor TR4 may be a source terminal.

The fourth transistor TR4 may apply the initialization voltage VINT to the gate terminal of the first transistor TR1 while the data initialization signal GI is activated. In this case, the fourth transistor TR4 may operate in the linear region. Thus, the fourth transistor TR4 may initialize the gate terminal of the first transistor TR1 as the initialization voltage VINT while the data initialization signal GI is activated. In example embodiments, a voltage level of the initialization voltage VINT is sufficiently lower than a voltage level of the data signal DATA maintained by the storage capacitor CST in a previous frame. The initialization voltage VINT may be applied to the gate terminal of the first transistor TR1 that is a P-channel metal oxide semiconductor (PMOS) type transistor. In some example embodiments, a voltage level of the initialization voltage VINT is sufficiently higher than the voltage level of the data signal DATA maintained by the storage capacitor CST in a previous frame. The initialization voltage VINT may be applied to the gate terminal of the first transistor TR1 that is an N-channel metal oxide semiconductor (NMOS) type transistor.

In example embodiments, the data initialization signal GI is identical to the scan signal GW advanced by one horizontal time period. For example, the data initialization signal GI is applied to pixels located in the (n)th row among a plurality of pixels included in a display panel (where n is an integer of 2 or more) is substantially the same as the scan signal GW applied to pixels located in the (n−1)th row among a plurality of the pixels. Thus, the data initialization signal GI that is activated may be applied to pixels located in the (n)th row among the pixels by applying the scan signal GW that is activated to pixels located in the (n−1)th row among the pixels. As a result, the gate terminal of the first transistor TR1 included in pixels located in the (n)th row among the pixels may be initialized as the initialization voltage VINT when the data signal DATA is applied to pixels located in the (n−1)th row among the pixels.

A fifth transistor TR5 may apply a second power voltage ELVDD to the first terminal of the first transistor TR1 while an emission signal EM is activated. In some example embodiments, the fifth transistor TR5 does not apply the second power voltage ELVDD while the emission signal EM is inactivated. In this case, the fifth transistor TR5 may operate in the linear region. The fifth transistor TR5 may apply the second power voltage ELVDD to the first terminal of the first transistor TR1 while the emission signal EM is activated such that the first transistor TR1 generates the driving current ID. In addition, in some embodiments, the fifth transistor TR5 does not apply the second power voltage ELVDD while the emission signal EM is inactivated such that the data signal DATA applied to the first terminal of the first transistor TR1 is applied to the gate terminal of the first transistor TR1.

A sixth transistor TR6 may include a gate terminal, a first terminal, and a second terminal. The emission signal EM may be applied to the gate terminal of the sixth transistor TR6. The first terminal of the sixth transistor TR6 may be connected to the second terminal of the first transistor TR1. The second terminal of the sixth transistor TR6 may be connected to the first terminal of the OLED. In example embodiments, the first terminal of the sixth transistor TR6 is a source terminal, and the second terminal of the sixth transistor TR6 is a drain terminal. In some example embodiments, the first terminal of the sixth transistor TR6 is a drain terminal, and the second terminal of the sixth transistor TR6 is a source terminal.

The sixth transistor TR6 may provide the driving current ID generated by the first transistor TR1 to the OLED while the emission signal EM is activated. In this case, the sixth transistor TR6 may operate in the linear region. Thus, the sixth transistor TR6 may provide the driving current ID generated by the first transistor TR1 to the OLED while the emission signal EM is activated such that the OLED emits light. In addition, the sixth transistor TR6 may disconnect the first transistor TR1 from the OLED while the emission signal EM is inactivated such that the compensated data signal DATA applied to the second terminal of the first transistor TR1 is applied to the gate terminal of the first transistor TR1.

The seventh transistor TR7 may include a gate terminal, a first terminal, and a second terminal. A diode initialization signal (e.g., the data initialization signal GI) may be applied to the gate terminal of the seventh transistor TR7. The initialization voltage VINT may be applied to the first terminal of the seventh transistor TR7. The second terminal of the seventh transistor TR7 may be connected to the first terminal of the OLED. In example embodiments, the first terminal of the seventh transistor TR7 is a source terminal, and the second terminal of the seventh transistor TR7 is a drain terminal. In some example embodiments, the first terminal of the seventh transistor TR7 is a drain terminal, and the second terminal of the seventh transistor TR7 is a source terminal.

The seventh transistor TR7 may apply the initialization voltage VINT to the first terminal of the OLED while the diode initialization signal is activated. In this case, the seventh transistor TR7 may operate in the linear region. Thus, the seventh transistor TR7 may initialize the first terminal of the OLED as the initialization voltage VINT while the diode initialization signal is activated.

In example embodiments, the data initialization signal GI and the diode initialization signal are the substantially same signal. An initialization operation of the gate terminal of the first transistor TR1 may do not affect an initialization operation of the first terminal of the OLED. That is, the initialization operation of the gate terminal of the first transistor TR1 and the initialization operation of the first terminal of the OLED may be independent to each other. Therefore, the data initialization signal GI is used as the diode initialization signal, thereby improving the manufacturing efficiency.

The storage capacitor CST may include the first terminal and the second terminal, and may be connected between a second power voltage ELVDD wiring and the gate terminal of the first transistor TR1. For example, the first terminal of the storage capacitor CST may be connected to the gate terminal of the first transistor TR1, and the second terminal of the storage capacitor CST may be connected to the second power supply voltage ELVDD wiring. The storage capacitor CST may maintain a voltage level of the gate terminal of the first transistor TR1 while the scan signal GW is inactivated. The emission signal EM may be activated while the scan signal GW is inactivated. The driving current ID generated by the first transistor TR1 may be provided to the OLED while the emission signal EM is activated. Therefore, the driving current ID generated by the first transistor TR1 may be provided to the OLED based on the voltage level maintained by the storage capacitor CST.

In example embodiments, the anode terminal of the OLED may be the lower electrode 290, and the cathode terminal of the OLED may be the upper electrode 340. In addition, the first semiconductor element 250 may be the sixth transistor TR6, and the second semiconductor element 255 may be the first transistor TR1. Further, the wiring pattern 200 may be an emission signal wiring providing the emission signal EM.

In another cross-sectional view of FIG. 1, the third transistor TR3 may be illustrated in the OLED display device 100 of FIG. 3A. In this case, the wiring pattern 200 may be scan signal wiring providing the scan signal GW.

Referring again to FIGS. 1, 2, and 3A, the wiring pattern 200 may transmit a light incident from the outside via the openings 55 in the transparent region III. For example, although the first wiring extension 203 of the wiring pattern 200 is disposed in the transparent region III, an image of an object that is located in the back of the OLED display device 100 may be transmitted via the openings 55. However, a width W3 of lines each constituting the first wiring extension 203 may be formed below about 2.0 micrometers such that the first wiring extension 203 is not recognized by the user of the OLED display device 100. Accordingly, since an opaque portion (e.g., a portion where opaque conductive wirings are disposed) extending along the first direction D1 of the pixel regions 10 in the conventional OLED display device is not existing, the OLED display device according to example embodiments may have the number of slits relatively less than the conventional OLED display device. Thus, a diffraction phenomenon of the OLED display device 100 may be improved. As the OLED display device 100 including the wiring pattern 200 improves a diffraction phenomenon of a light transmitting the transparent region III, the OLED display device 100 having an improved visibility may sever as a transparent OLED display device.

The openings 55 of the first wiring extension 203 may be regularly arranged in the transparent region III. A shape of the openings 55 each may have a planar shape of a tetragonal opening, a diamond opening, a triangle opening, a polygonal opening, a circular opening, an athletic track opening, or an elliptical opening. The first wiring extension 203, the second wiring extension 205, and the conductive pattern 180 may be simultaneously formed using the same materials. Alternatively, the wiring pattern 200, the first and second gate electrodes 170 and 175 may be simultaneously formed using the same materials, or the wiring pattern 200, the first and second source electrodes 210 and 215, and the first and second drain electrodes 230 and 235 may be simultaneously formed using the same materials.

In example embodiments, each of the wiring pattern 200 and the conductive pattern 180 may have the same height extending in a third direction D3 that is vertical to an upper surface of the substrate 110. Alternatively, the first wiring extension 203 and the second wiring extension 205 may have the same height extending in the third direction D3. Each of the wiring pattern 200 and the conductive pattern 180 may be formed of a metal, a metal alloy, a metal nitride, a conductive metal oxide, transparent conductive materials, etc. For example, each of the wiring pattern 200 and the conductive pattern 180 may include aluminum (Al), an alloy of aluminum, aluminum nitride (AlNx), silver (Ag), an alloy of silver, tungsten (W), tungsten nitride (WNx), copper (Cu), an alloy of copper, nickel (Ni), chrome (Cr), chrome nitride (CrNx), molybdenum (Mo), an alloy of molybdenum, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), stannum oxide (SnOx), indium oxide (InOx), gallium oxide (GaOx), indium tin oxide (ITO), indium zinc oxide (IZO), etc. These may be used alone or in a suitable combination thereof. In example embodiments, each of the wiring pattern 200 and the conductive pattern 180 may have a multilayer structure. The multilayer structure may be Ti/Al/Ti or Mo/Al. Alternatively, each of the wiring pattern 200 and the conductive pattern 180 may be formed as a single layer.

The second insulating interlayer 195 may be disposed on the first wiring extension 203, the second wiring extension 205, and the conductive pattern 180. The second insulating interlayer 195 may cover the first wiring extension 203, the second wiring extension 205, and the conductive pattern 180 in the transparent region III, the sub-pixel region II, and the opaque region IV, and may extend in the first direction D1 on the first insulating interlayer 190. That is, the second insulating interlayer 195 may be disposed on the entire first insulating interlayer 190. In example embodiments, the second insulating interlayer 195 may sufficiently cover the first and second gate electrodes 170 and 175, and may have a substantially even surface without a step around the first wiring extension 203, the second wiring extension 205, and the conductive pattern 180. Alternatively, the second insulating interlayer 195 may cover the first wiring extension 203, the second wiring extension 205, and the conductive pattern 180, and may be disposed as a substantially uniform thickness along a profile of the first wiring extension 203, the second wiring extension 205, and the conductive pattern 180. The second insulating interlayer 195 may include a silicon compound, a metal oxide, etc.

The first and second source electrodes 210 and 215 and the first and second drain electrodes 230 and 235 may be disposed on the second insulating interlayer 195. Each of the first and second source electrodes 210 and 215 may be in contact with a first side (e.g., a source region) of the first and second active layers 130 and 135 each via a contact hole formed by removing a portion of the gate insulation layer 150, the first insulating interlayer 190, and the second insulating interlayer 195. Each of the first and second drain electrodes 230 and 235 may be in contact with a second side (e.g., a drain region) of the first and second active layers 130 and 135 via a contact hole formed by removing a portion of the gate insulation layer 150, the first insulating interlayer 190, and the second insulating interlayer 195. Each of the first and second source electrodes 210 and 215 and the first and second drain electrodes 230 and 235 may be formed of a metal, an alloy, a metal nitride, a conductive metal oxide, transparent conductive materials, etc. These may be used alone or in a suitable combination thereof. Alternatively, each of the first and second source electrodes 210 and 215 and the first and second drain electrodes 230 and 235 may have a multilayer structure. Accordingly, the first semiconductor element 250 (e.g., a switching transistor) including the first active layer 130, the first gate electrode 170, the first source electrode 210, and the first drain electrode 230 and the second semiconductor element 255 (e.g., a driving transistor) including the second active layer 135, the second gate electrode 175, the second source electrode 215, and the second drain electrode 235 may be disposed in the sub-pixel region II and the opaque region IV. In addition, the storage capacitor including the second gate electrode 175 and the conductive pattern 180 may be disposed in the sub-pixel region II and the opaque region IV.

In example embodiments, the semiconductor elements of the OLED display device 100 may have a top gate structure, but not being limited thereto. In some example embodiments, for example, the semiconductor elements may have a bottom gate structure.

In addition, the semiconductor elements of the OLED display device 100 may be disposed in the sub-pixel region II, but not being limited thereto. For example, the semiconductor elements may be disposed in the opaque region IV.

The planarization layer 270 may be disposed on the first and second source electrodes 210 and 215 and the first and second drain electrodes 230 and 235 (or, the first semiconductor element 250 and the second semiconductor element 255). The planarization layer 270 may cover the first and second source electrodes 210 and 215 and the first and second drain electrodes 230 and 235 in the sub-pixel region II and the opaque region IV, and may extend in the first direction D1 on the second insulating interlayer 195. That is, the planarization layer 270 may be disposed on the entire substrate 110. For example, the planarization layer 270 may be disposed as a relatively high thickness to sufficiently cover the first and second source electrodes 210 and 215 and the first and second drain electrodes 230 and 235. In this case, the planarization layer 270 may have a substantially even upper surface, and a planarization process may be further performed on the planarization layer 270 to implement the even upper surface of the planarization layer 270. Alternatively, the planarization layer 270 may cover the first and second source electrodes 210 and 215 and the first and second drain electrodes 230 and 235, and may be disposed as a substantially uniform thickness along a profile of the first and second source electrodes 210 and 215 and the first and second drain electrodes 230 and 235. The planarization layer 270 may include organic materials or inorganic materials.

The lower electrode 290 may be disposed in the sub-pixel region II on the planarization layer 270. The lower electrode 290 may be in contact with the first drain electrode 230 of the first semiconductor element 250 via a contact hole formed by removing a portion of the planarization layer 270. In addition, the lower electrode 290 may be electrically connected to the first semiconductor element 250. The lower electrode 290 may be formed of a metal, a metal alloy, a metal nitride, a conductive metal oxide, transparent conductive materials, etc. Alternatively, the lower electrode 290 may have a multilayer structure.

The pixel defining layer 310 may be disposed in the opaque region IV on the planarization layer 270 such that the pixel defining layer 310 exposes the transparent region III and a portion of the lower electrode 290 in the sub-pixel region II. The light emitting layer 330 may be disposed on a portion of the lower electrode 290 that is exposed by the pixel defining layer 310. The pixel defining layer 310 may have an opaque color such that a light incident from the outside is not reflected from the wiring pattern 200 that is disposed under the pixel defining layer 310. Alternatively, the pixel defining layer 310 may have a substantially transparent color. The pixel defining layer 310 may be formed of organic materials or inorganic materials. In example embodiments, the pixel defining layer 310 may include organic materials such as a photoresist, a polyacryl-based resin, a polyimide-based resin, a polyamide-based resin, a siloxane-based resin, an acryl-based resin, an epoxy-based resin, etc.

The light emitting layer 330 may be disposed on a portion of the lower electrode 290 that is exposed by the pixel defining layer 310. The light emitting layer 330 may have a multi-layered structure including an emission layer (EL), a hole injection layer (HIL), a hole transfer layer (HTL), an electron transfer layer (ETL), an electron injection layer (EIL), etc. The EL of the light emitting layer 330 may be formed using at least one of light emitting materials capable of generating different colors of light (e.g., a red color of light, a blue color of light, and a green color of light, etc) according to first, second, and third sub-pixels illustrated in FIG. 1. Alternatively, the EL of the light emitting layer 330 may generally generate a white color of light by stacking a plurality of light emitting materials capable of generating different colors of light such as a red color of light, a green color of light, a blue color of light, etc. In some example embodiments, the HIL, the HTL, the ETL, the EIL, etc except the EL may be disposed in the transparent region III.

The upper electrode 340 may be disposed on the pixel defining layer 310, a portion of the planarization layer 270 in the transparent region III, and the light emitting layer 330. The upper electrode 340 may cover the pixel defining layer 310, a portion of the planarization layer 270 in the transparent region III, and the light emitting layer 330 in the sub-pixel region II, the transparent region III, and the opaque region IV, and may extend in the first direction D1 on the pixel defining layer 310, a portion of the planarization layer 270 in the transparent region III, and the light emitting layer 330. That is, the upper electrode 340 may be disposed on the entire substrate 110. The upper electrode 340 may be formed of a metal, a metal alloy, a metal nitride, a conductive metal oxide, transparent conductive materials, etc. These may be used alone or in a suitable combination thereof. Accordingly, the pixel structure including the lower electrode 290, the light emitting layer 330, and the upper electrode 340 may be disposed. Alternatively, the upper electrode 340 may not be disposed in the transparent region III to increase a transmissivity of the OLED display device 100.

The encapsulation substrate 350 may be disposed on the upper electrode 340. The encapsulation substrate 350 and the substrate 110 may include substantially the same materials. For example, the encapsulation substrate 350 may include quartz, synthetic quartz, calcium fluoride, fluoride-doping quartz, sodalime glass, non-alkali glass etc. In some example embodiments, the encapsulation substrate 350 may include a transparent inorganic material or flexible plastic. For example, the encapsulation substrate 350 may include a flexible transparent resin substrate. In this case, to increase flexibility of the OLED display device 100, the encapsulation substrate 350 may include a stacked structure where at least one inorganic layer and at least one organic layer are alternately stacked.

As the OLED display device 100 in accordance with example embodiments includes the wiring pattern 200 having the openings 55, the OLED display device 100 may remove an opaque portion (e.g., the pixel defining layer 310) surrounding the transparent region III. Accordingly, the OLED display device 100 may serve as a transparent OLED display device that a visibility is improved.

FIGS. 4, 5, 6, 7, 8, and 9 are cross-sectional views illustrating a method of manufacturing an OLED display device in accordance with example embodiments.

Figure 4:
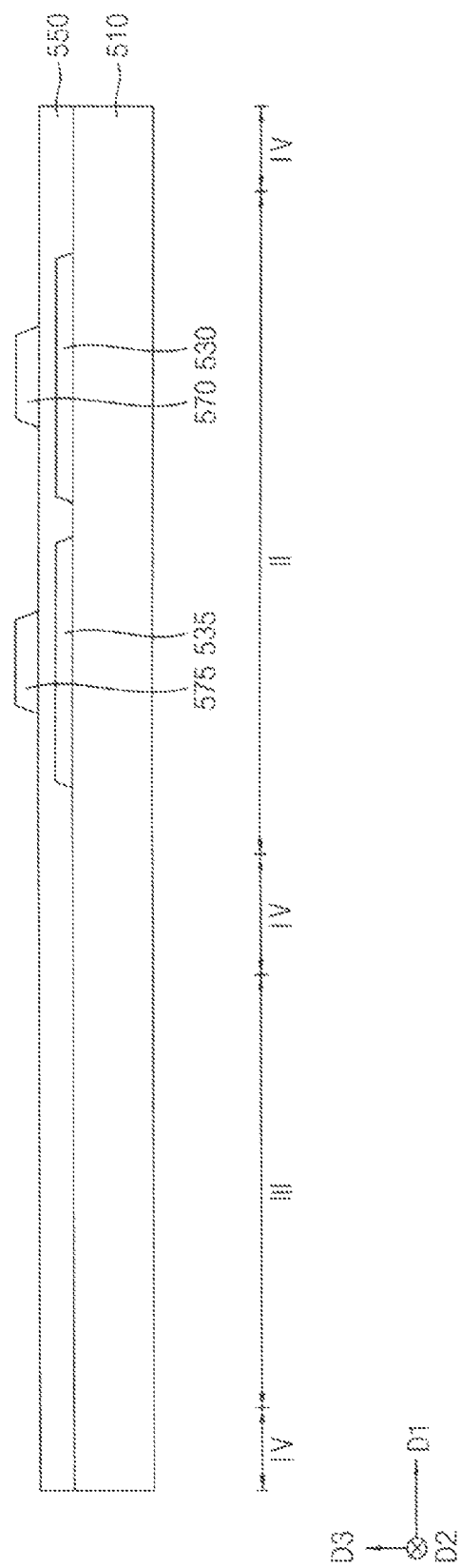
FIGS. 4, 5, 6, 7, 8, and 9 are cross-sectional views illustrating a method of manufacturing an OLED display device in accordance with example embodiments.

Referring to FIG. 4, first and second active layers 530 and 535 may be formed in a sub-pixel region II on a substrate 510. The substrate 510 may be formed using quartz, synthetic quartz, calcium fluoride, fluoride-doping quartz, a sodalime glass, a non-alkali glass etc. Alternatively, a buffer layer (not shown) may be formed on the substrate 510. The buffer layer may extend along a first direction from the transparent region III into the sub-pixel region II on the substrate 510. That is, the buffer layer may be entirely formed on the substrate 510. The buffer layer may prevent the diffusion of metal atoms and/or impurities from the substrate 510. The first and second active layers 530 and 535 may be formed using an oxide semiconductor, an inorganic semiconductor, an organic semiconductor, etc. A gate insulation layer 550 may be formed on the substrate 510. The gate insulation layer 550 may cover the first and second active layers 530 and 535, and may extend in the first direction on the substrate 510. The gate insulation layer 550 may be entirely formed in the sub-pixel region II, the transparent region III, and the opaque region IV on the substrate 510. The gate insulation layer 550 may be formed using a silicon compound, a metal oxide, etc. First and second gate electrodes 570 and 575 may be formed on the gate insulation layer 550 under which the first and second active layers 530 and 535 are disposed, respectively. Each of the first and second gate electrodes 570 and 575 may be formed using a metal, an alloy, a metal nitride, a conductive metal oxide, transparent conductive materials, etc.

Figure 5:
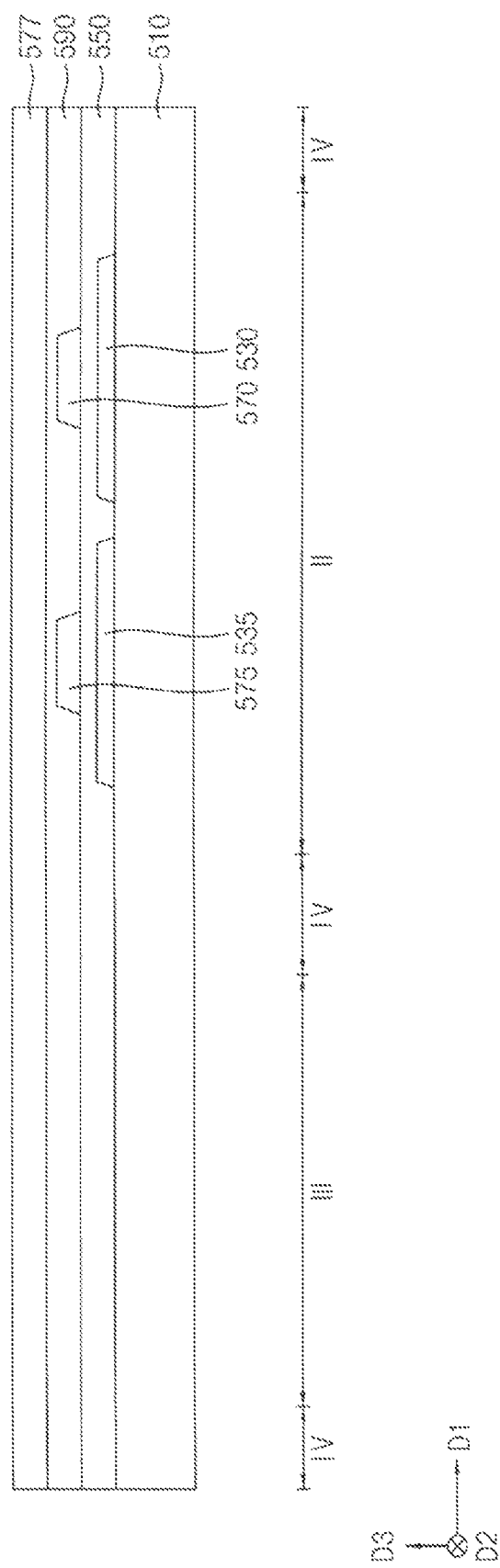

Referring to FIG. 5, a first insulating interlayer 590 may be formed on the first and second gate electrodes 570 and 575. The first insulating interlayer 590 may cover the first and second gate electrodes 570 and 575, and may extend in the first direction on the gate insulation layer 550. The first insulating interlayer 590 may be entirely formed in the sub-pixel region II, the transparent region III, and the opaque region IV on the gate insulation layer 550. The first insulating interlayer 590 may be formed using a silicon compound, a metal oxide, etc. A metal layer 577 may be formed on the first insulating interlayer 590. The metal layer 577 may be formed on the entire first insulating interlayer 590.

Figure 6:
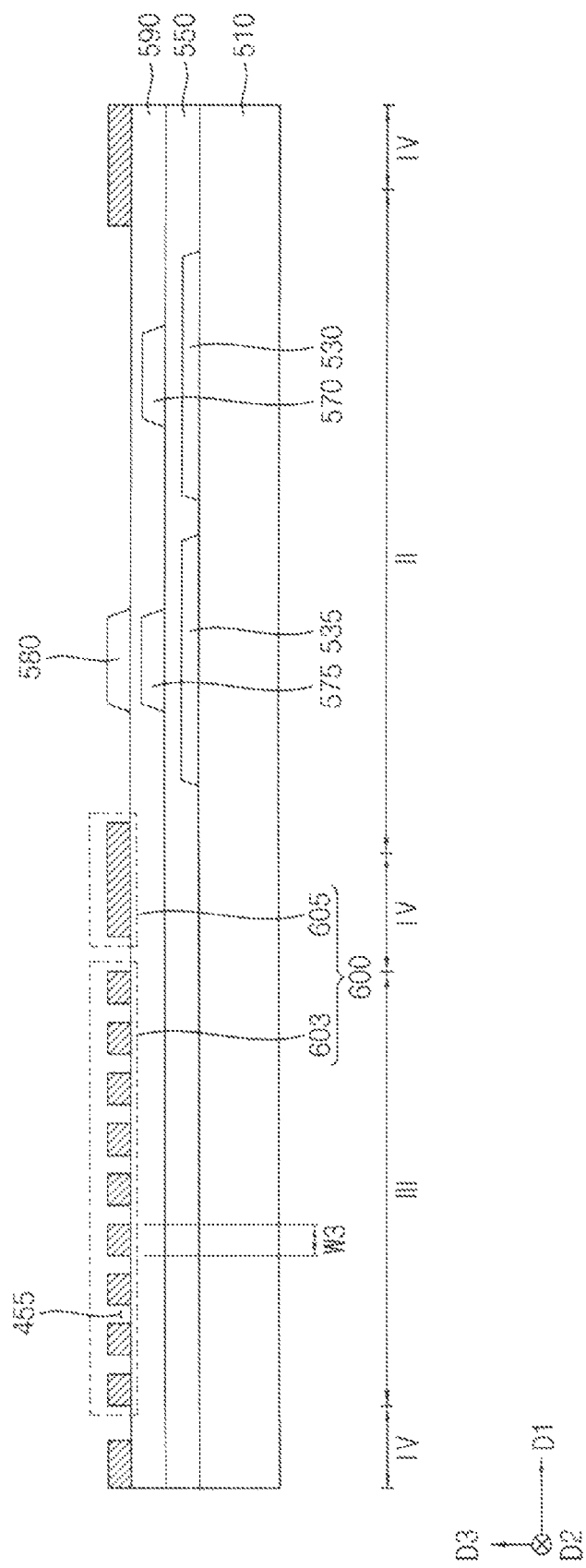

Referring to FIG. 6, a wiring pattern 600 and a conductive pattern 580 may be formed by patterning the metal layer 577 (see FIG. 5). For example, the conductive pattern 580 may be formed on a portion of the first insulating interlayer 590 under which the second gate electrode 575 is located.

The wiring pattern 600 may be formed in the sub-pixel region II, the transparent region III, and the opaque region IV on the first insulating interlayer 590. In example embodiments, the wiring pattern 600 may include a first wiring extension 603 and a second wiring extension 605. As illustrated in FIGS. 2 and 6 together, the first wiring extension 603 may have a first width W1, may be located in the transparent region III. The second wiring extension 605 may have a second width W2 that is less than the first width W1, and may be located in the opaque region IV and the sub-pixel region II. The first wiring extension 603 may include have a mesh structure including a plurality of openings 455, and the second wiring extension 605 may have a planar shape of a bar extending in the first direction D1. The first wiring extension 603 and the second wiring extension 605 may be electrically connected to each other, and may be integrally formed. The second wiring extension 605 may be disposed in the sub-pixel region II, and may be electrically connected to a first semiconductor element 650 and/or a second semiconductor element 655 (shown in FIG. 7).

The wiring pattern 600 may be metal wirings (e.g., a power supply voltage wiring, a scan signal wiring, a data signal wiring, an emission signal wiring, etc). The wiring pattern 600 may transmit a light incident from the outside via the openings 455 in the transparent region III. A width W3 of lines each constituting the first wiring extension 603 may be formed below about 2.0 micrometers such that the first wiring extension 603 is not recognized by the user of the OLED display device.

The openings 455 of the first wiring extension 603 may be regularly arranged in the transparent region III. A shape of the openings 455 each may have a planar shape of a tetragonal opening, a diamond opening, a triangle opening, a polygonal opening, a circular opening, an athletic track opening, or an elliptical opening. The first wiring extension 603, the second wiring extension 605, and the conductive pattern 580 may be simultaneously formed using the same materials. In example embodiments, each of the wiring pattern 600 and the conductive pattern 580 may have the same height extending in a third direction D3 that is vertical to an upper surface of the substrate 510. Each of the wiring pattern 600 and the conductive pattern 580 may be formed using a metal, a metal alloy, a metal nitride, a conductive metal oxide, transparent conductive materials, etc. For example, each of the wiring pattern 600 and the conductive pattern 580 may include Al, an alloy of aluminum, AlNx, Ag, an alloy of silver, W, WNx, Cu, an alloy of copper, Ni, Cr, CrNx, Mo, an alloy of molybdenum, Ti, TiNx, Pt, Ta, TaNx, Nd, Sc, SRO, ZnOx, SnOx, InOx, GaOx, ITO, IZO, etc. These may be used alone or in a suitable combination thereof. In example embodiments, each of the wiring pattern 600 and the conductive pattern 580 may have a multilayer structure. The multilayer structure may be Ti/Al/Ti or Mo/Al.

Figure 7:
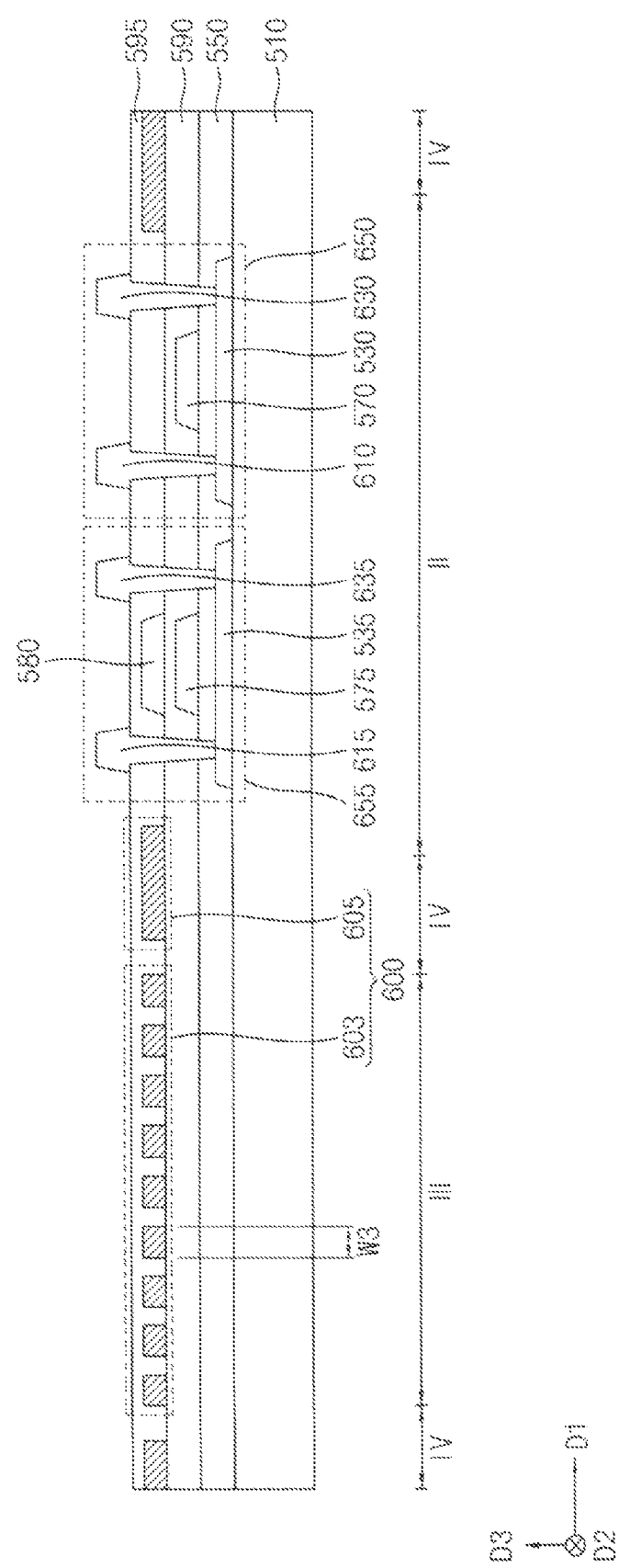

Referring to FIG. 7, a second insulating interlayer 595 may be formed on the first wiring extension 603, the second wiring extension 605, and the conductive pattern 580. The second insulating interlayer 595 may cover the first wiring extension 603, the second wiring extension 605, and the conductive pattern 580 in the transparent region III, the sub-pixel region II, and the opaque region IV, and may extend in the first direction D1 on the first insulating interlayer 590. That is, the second insulating interlayer 595 may be formed on the entire first insulating interlayer 590. The second insulating interlayer 595 may be formed using a silicon compound, a metal oxide, etc.

First and second source electrodes 610 and 615 and the first and second drain electrodes 630 and 635 may be formed on the second insulating interlayer 595. Each of the first and second source electrodes 610 and 615 may be in contact with a first side (e.g., a source region) of the first and second active layers 530 and 535 each via a contact hole formed by removing a portion of the gate insulation layer 550, the first insulating interlayer 590, and the second insulating interlayer 595. Each of the first and second drain electrodes 630 and 635 may be in contact with a second side (e.g., a drain region) of the first and second active layers 530 and 535 via a contact hole formed by removing a portion of the gate insulation layer 550, the first insulating interlayer 590, and the second insulating interlayer 595. Each of the first and second source electrodes 610 and 615 and the first and second drain electrodes 630 and 635 may be formed using a metal, an alloy, a metal nitride, a conductive metal oxide, transparent conductive materials, etc. These may be used alone or in a suitable combination thereof. Accordingly, the first semiconductor element 650 including the first active layer 530, the first gate electrode 570, the first source electrode 610, the first drain electrode 630, the gate insulation layer 550, the first insulating interlayer 590, and the second insulating interlayer 595 may be formed, and the second semiconductor element 655 including the second active layer 535, the second gate electrode 575, the second source electrode 615, the second drain electrode 635, the gate insulation layer 550, the first insulating interlayer 590, and the second insulating interlayer 595 may be formed. In addition, the storage capacitor including the second gate electrode 575 and the conductive pattern 580 may be formed.

Figure 8:
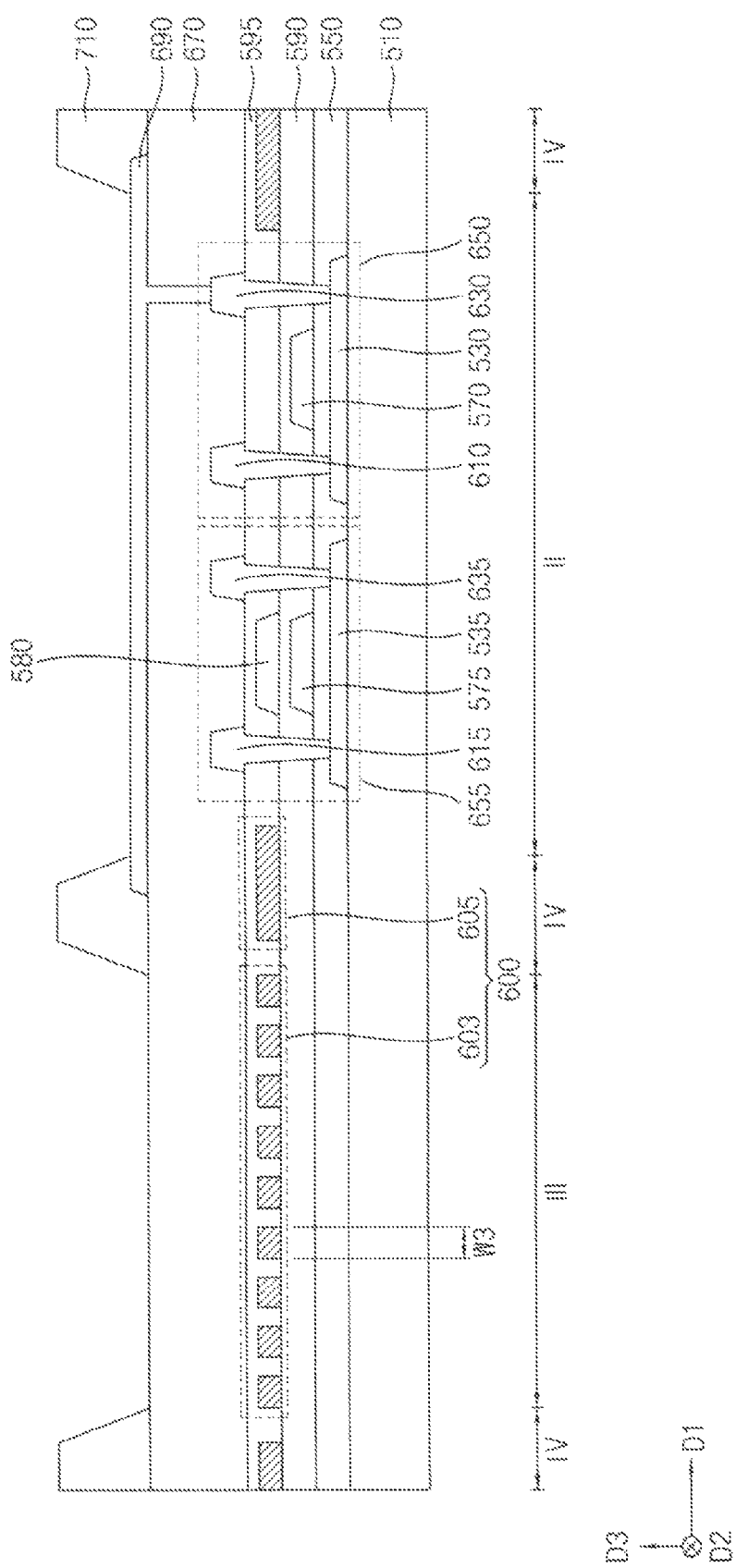

Referring to FIG. 8, a planarization layer 670 may be formed on second insulating interlayer 595. The planarization layer 670 may cover the first and second source electrodes 610 and 615 and the first and second drain electrodes 630 and 635, and may extend in the first direction D1 on the second insulating interlayer 595. The planarization layer 670 may be entirely formed in the sub-pixel region II, the transparent region III, and the opaque region IV on the substrate 510. The planarization layer 670 may be formed using organic materials or inorganic materials. A lower electrode 690 may be formed on the planarization layer 670. The lower electrode 690 may be in contact with the first drain electrode 630 of the first semiconductor element 650 via a contact hole formed by removing a portion of the planarization layer 670. The lower electrode 690 may be formed using a metal, a metal alloy, a metal nitride, a conductive metal oxide, transparent conductive materials, etc. A pixel defining layer 710 may be formed on a portion of the planarization layer 670 and a portion of the lower electrode 690. The pixel defining layer 710 may be formed on the planarization layer 670 such that the pixel defining layer 710 exposes the transparent region III and a portion of the lower electrode 690. The pixel defining layer 710 may be formed using organic materials or inorganic materials.

Figure 9:
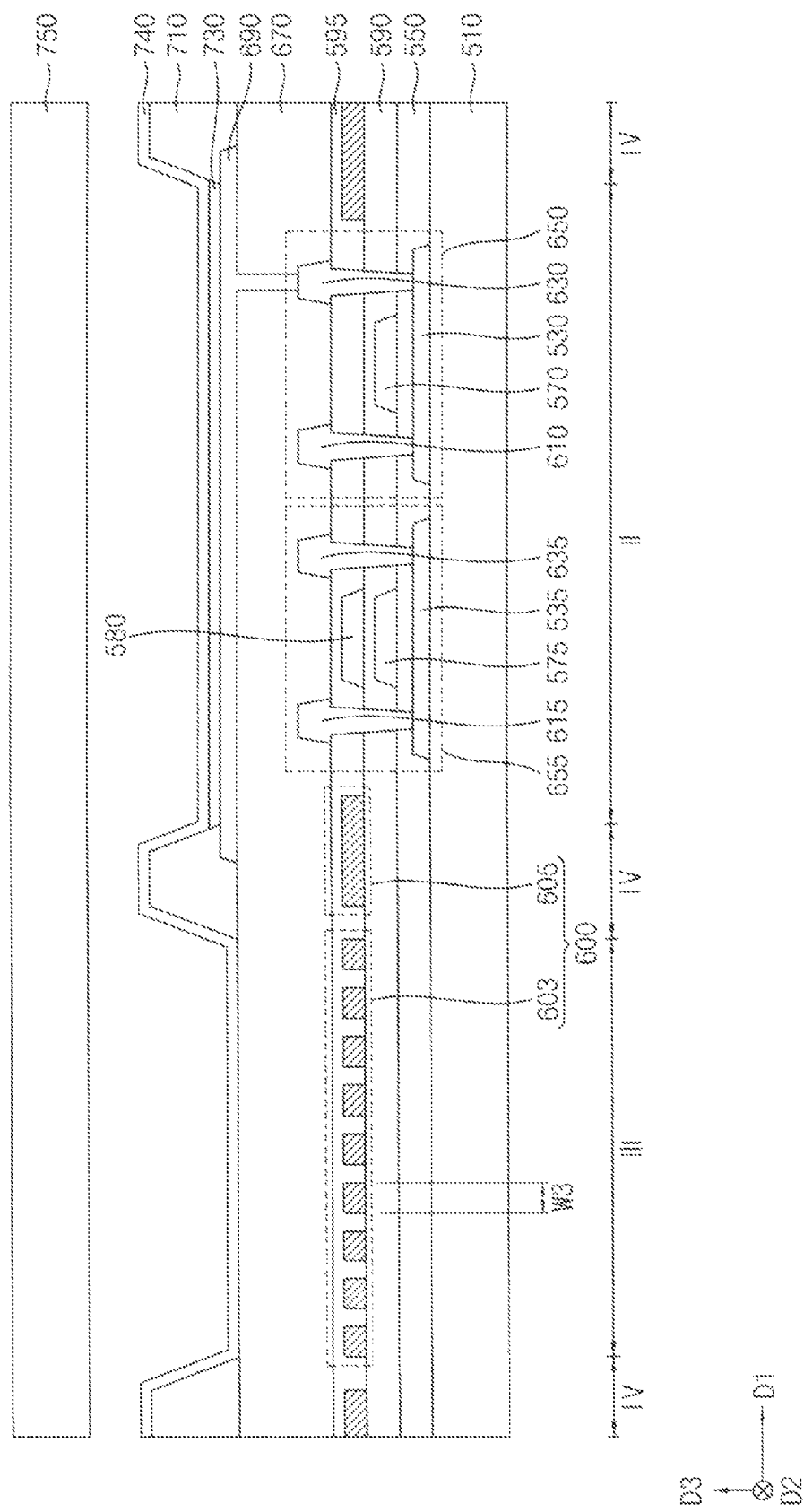

Referring to FIG. 9, a light emitting layer 730 may be formed on a portion of the lower electrode 690 that is exposed by the pixel defining layer 710. The light emitting layer 730 may be formed using at least one of light emitting materials capable of generating different colors of light (e.g., a red color of light, a blue color of light, and a green color of light, etc) according to first, second, and third sub-pixels illustrated in FIG. 1. An upper electrode 740 may be formed on the pixel defining layer 710 and the light emitting layer 730. The upper electrode 740 may cover the pixel defining layer 710, a portion of the planarization layer 670 in the transparent region III, and the light emitting layer 730 in the sub-pixel region II, the transparent region III, and the opaque region IV, and may extend in the first direction D1 on the pixel defining layer 710, a portion of the planarization layer 670 in the transparent region III, and the light emitting layer 730. That is, the upper electrode 740 may be formed on the entire substrate 510. The upper electrode 740 may be formed using a metal, a metal alloy, a metal nitride, a conductive metal oxide, transparent conductive materials, etc. These may be used alone or in a suitable combination thereof.

An encapsulation substrate 750 may be formed on the upper electrode 740. The encapsulation substrate 750 and the substrate 510 may include substantially the same materials. For example, the encapsulation substrate 750 may be formed using quartz, synthetic quartz, calcium fluoride, fluoride-doping quartz, sodalime glass, non-alkali glass etc. The encapsulation substrate 750 is combined with the substrate 510 by performing an encapsulation process on the upper electrode 740. Accordingly, the OLED display device in FIG. 9 may be manufactured.

Figure 10:
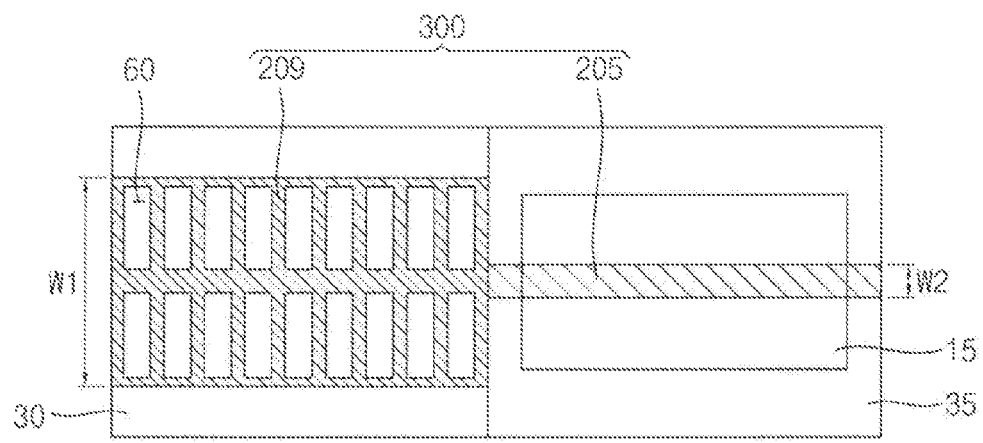
FIG. 10 is a planar view illustrating an example of a wiring pattern included in the OLED display device of FIG. 1.

FIG. 10 is a planar view illustrating an example of a wiring pattern included in the OLED display device of FIG. 1. A wiring pattern 300 included in an OLED display device illustrated in FIG. 10 may have a configuration substantially the same as or similar to that of a wiring pattern 200 included in an OLED display device 100 described with reference to FIG. 2 except a first wiring extension 209. In FIG. 10, detailed descriptions for elements, which are substantially the same as or similar to the elements described with reference to FIG. 2, will be omitted.

Referring to FIGS. 1 and 10, the wiring pattern 300 may be disposed in a first sub-pixel region 15, a transparent region 30, and an opaque region 35 on a substrate. In example embodiments, the wiring pattern 300 may include the first wiring extension 209 and a second wiring extension 205. The first wiring extension 209 may have a first width W1, and may be located in the transparent region 30. The second wiring extension 205 may have a second width W2, and may be located in the first sub-pixel region 15 and the opaque region 35. The first wiring extension 209 may have a mesh structure including a plurality of openings 60, and the second wiring extension 205 may have a planar shape of a bar extending in a first direction D1 that is from the transparent region 30 into sub-pixel region 15. The first wiring extension 209 and the second wiring extension 205 may be integrally formed. In other word, the wiring pattern 300 may be spatially divided by the openings 60 in the transparent region 30. Alternatively, the second wiring extension 205 may be only disposed in the opaque region 35.

The mesh structure (e.g., a width of lines each constituting the first wiring extension 209) surrounding the openings 60 may be formed below about 2.0 micrometers such that the mesh structure is not observed (e.g., recognized) by a user of the OLED display device. The openings 60 may be regularly arranged in the transparent region 30. A shape of the openings 60 each may have a planar shape of a tetragonal opening or a square opening. Alternatively, a shape of the openings 60 each may have a planar shape of a triangle opening, a diamond opening, a polygonal opening, a circular opening, an athletic track opening, or an elliptical opening. The first wiring extension 209 and the second wiring extension 205 may be simultaneously formed using the same materials. Alternatively, the openings 60 may be irregularly arranged.

Figure 11:
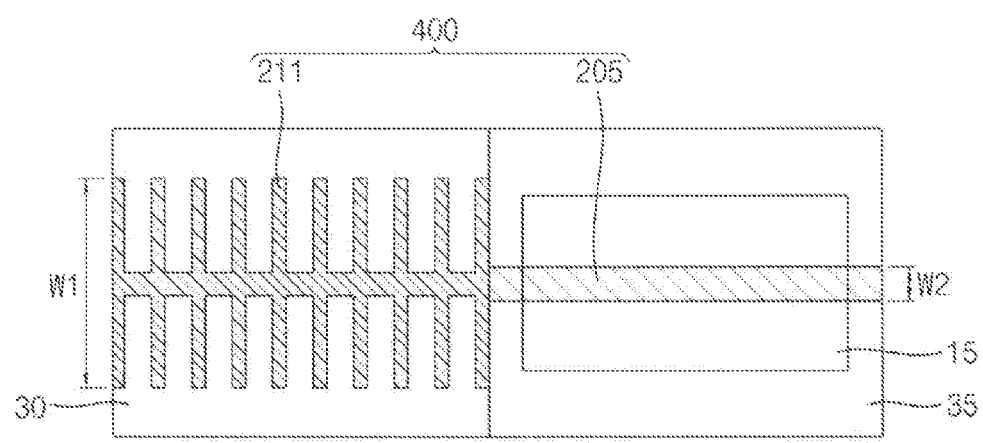
FIG. 11 is a planar view illustrating another example of a wiring pattern included in the OLED display device of FIG. 1.

FIG. 11 is a planar view illustrating another example of a wiring pattern included in the OLED display device of FIG. 1. A wiring pattern 400 included in an OLED display device illustrated in FIG. 11 may have a configuration substantially the same as or similar to that of a wiring pattern 200 included in an OLED display device 100 described with reference to FIG. 2 except a first wiring extension 211. In FIG. 11, detailed descriptions for elements, which are substantially the same as or similar to the elements described with reference to FIG. 2, will be omitted.

Referring to FIGS. 1 and 11, the wiring pattern 400 may include the first wiring extension 211 and a second wiring extension 205. The first wiring extension 211 may have a first width W1, and may be located in the transparent region 30. The second wiring extension 205 may have a second width W2, and may be located in the first sub-pixel region 15 and the opaque region 35. The first wiring extension 211 may have a structure that a wiring of a substantially H shape is repeatedly disposed in a first direction D1. In addition, the second wiring extension 205 may have a planar shape of a bar extending in the first direction D1. The first wiring extension 211 and the second wiring extension 205 may be integrally formed.

The structure (e.g., a width of lines each constituting the first wiring extension 211) may be formed below about 2.0 micrometers such that the mesh structure is not observed by a user of the OLED display device.

Figure 12:
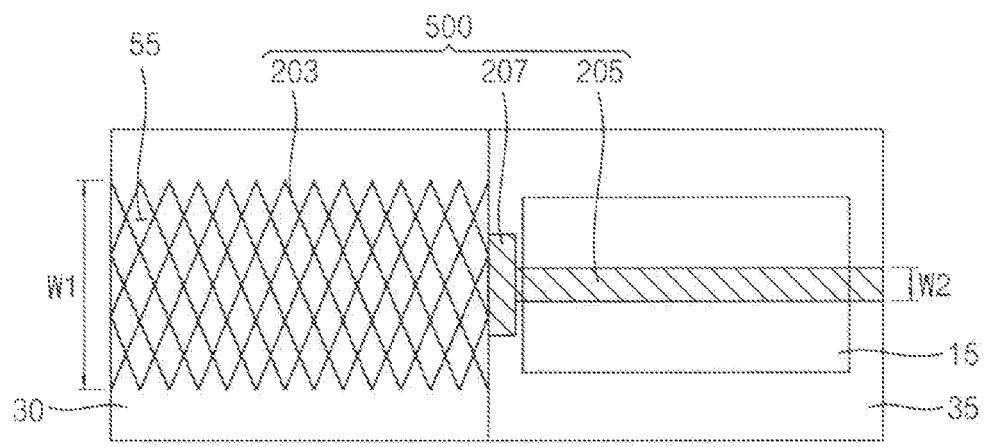
FIG. 12 is a planar view illustrating still another example of a wiring pattern included in the OLED display device of FIG. 1.

FIG. 12 is a planar view illustrating still another example of a wiring pattern included in the OLED display device of FIG. 1. A wiring pattern 500 included in an OLED display device illustrated in FIG. 12 may have a configuration substantially the same as or similar to that of a wiring pattern 200 included in an OLED display device 100 described with reference to FIG. 2 except a third wiring extension 207. In FIG. 12, detailed descriptions for elements, which are substantially the same as or similar to the elements described with reference to FIG. 2, will be omitted.

Referring to FIGS. 1 and 12, the wiring pattern 500 may be disposed in a first sub-pixel region 15, a transparent region 30, and an opaque region 35 on a substrate. In example embodiments, the wiring pattern 500 may include a first wiring extension 203, a second wiring extension 205, and the third wiring extension 207. The first wiring extension 203 may have a first width W1 extending in a second direction D2, and may be located in the transparent region 30. The second wiring extension 205 may have a second width W2, and may be located in the first sub-pixel region 15 and the opaque region 35. The third wiring extension 207 may have a fourth width extending in the second direction D2, and may be located in the opaque region 35. Here, the fourth width may be greater than the second width W2. Alternatively, the third wiring extension 207 may be formed as the first width W1. The third wiring extension 207 may be interposed between the first and second wiring extensions 203 and 205, and may extend along the first direction D1 in the opaque region 35. The first, second, and third wiring extensions 203, 205, and 207 may be integrally formed. In example embodiments, a first side of the third wiring extension 207 may be in contact with the first wiring extension 203, and a second side of the third wiring extension 207 may be in contact with the second wiring extension 205. Since the third wiring extension 207 is opaque, the third wiring extension 207 may be located under a pixel defining layer disposed in the opaque region 35. Here, the pixel defining layer may have an opaque color. The third wiring extension 207 may have a planar shape of a bar extending in the second direction D2. As the first side of the third wiring extension 207 having the fourth width is in contact with the first wiring extension 203 having the first width W1, a contact area may be relatively increased. That is, a wiring resistance of the wiring pattern 500 may be decreased.

Figure 13:
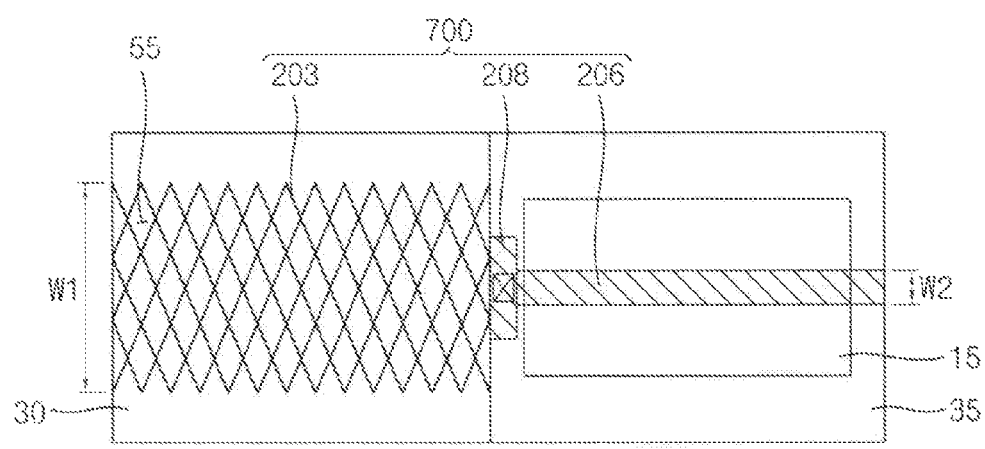
FIG. 13 is a planar view illustrating further still another example of a wiring pattern included in the OLED display device of FIG. 1.

FIG. 13 is a planar view illustrating further still another example of a wiring pattern included in the OLED display device of FIG. 1. A wiring pattern 700 included in OLED display device illustrated in FIG. 13 may have a configuration substantially the same as or similar to that of a wiring pattern 200 included in an OLED display device 100 described with reference to FIG. 2 except a second wiring extension 206 and a third wiring extension 208. In FIG. 13, detailed descriptions for elements, which are substantially the same as or similar to the elements described with reference to FIG. 2, will be omitted.

Referring to FIGS. 1 and 13, the wiring pattern 700 may be disposed in a first sub-pixel region 15, a transparent region 30, and an opaque region 35 on a substrate. In example embodiments, the wiring pattern 700 may include a first wiring extension 203, the second wiring extension 206, and the third wiring extension 208. The first wiring extension 203 may have a first width W1 extending in a second direction D2, and may be located in the transparent region 30. The second wiring extension 206 may have a second width W2, and may be located in the first sub-pixel region 15 and the opaque region 35. The third wiring extension 208 may have a fourth width extending in the second direction D2, and may be located in the opaque region 35. Here, the fourth width may be greater than the second width W2. Alternatively, the third wiring extension 208 may be formed as the first width W1.

The first wiring extension 203 and the third wiring extension 208 may be integrally formed, and may be disposed on the second wiring extension 206. For example, the third wiring extension 208 may overlap at least a portion of the second wiring extension 206, and may be in contact with the second wiring extension 206 by perforating a contact hole that is located in the overlapped portion. As the first side of the third wiring extension 208 having the fourth width is in contact with the first wiring extension 203 having the first width W1, a contact area may be relatively increased. That is, a wiring resistance of the wiring pattern 700 may be decreased.

Figure 14:
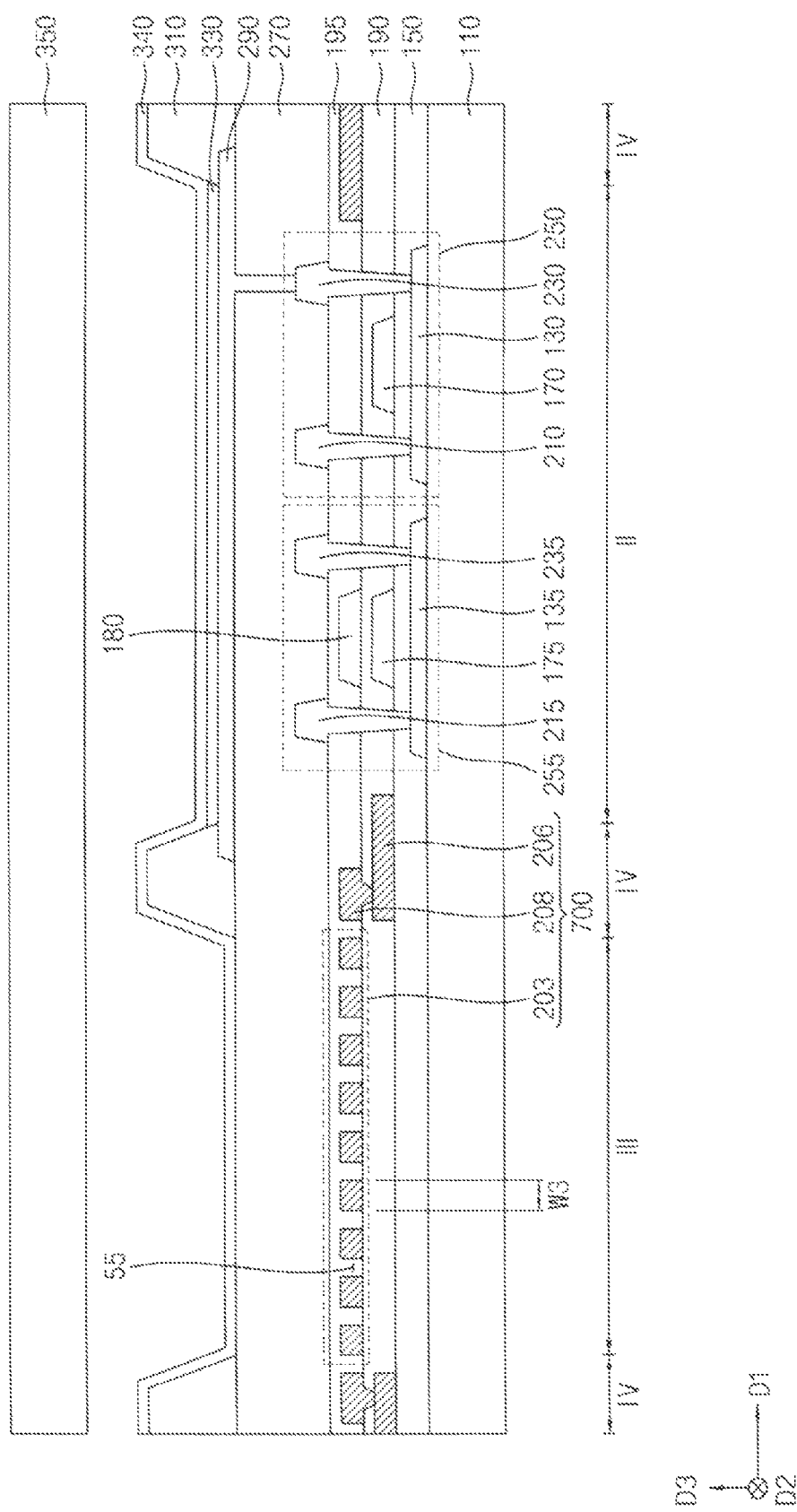
FIG. 14 is a cross-sectional view illustrating an example of the OLED display device including the wiring pattern of FIG. 13.

FIG. 14 is a cross-sectional view illustrating an example of the OLED display device including the wiring pattern 700 of FIG. 13. An OLED display device illustrated in FIG. 14 may have a configuration substantially the same as or similar to that of an OLED display device 100 described with reference to FIG. 3A except the wiring pattern 700. In FIG. 14, detailed descriptions for elements, which are substantially the same as or similar to the elements described with reference to FIG. 3A, will be omitted.

Referring to FIG. 14, an OLED display device may include a substrate 110, a gate insulation layer 150, a first insulating interlayer 190, a second insulating interlayer 195, a planarization layer 270, a first semiconductor element 250, a second semiconductor element 255, the wiring pattern 700, a pixel structure, a pixel defining layer 310, an encapsulation substrate 350, etc. Here, the pixel structure may include a lower electrode 290, a light emitting layer 330, and an upper electrode 340, and the first semiconductor element 250 may include a first active layer 130, a first gate electrode 170, a first source electrode 210, and a first drain electrode 230. In addition, the second semiconductor element 255 may include a second active layer 135, a second gate electrode 175, a conductive pattern 180, a second source electrode 215, and a second drain electrode 235.

In example embodiments, the wiring pattern 700 may be disposed in a transparent region III, an opaque region IV, and a sub-pixel region II. The wiring pattern 700 may be electrically connected to the first semiconductor element 250 and/or the second semiconductor element 255.

For example, a display image may be displayed in the sub-pixel regions II, and an image of an object that is located in the back of the OLED display device may be transmitted in the transparent region III. As the OLED display device includes the wiring pattern 700, the OLED display device may serve as a transparent OLED display device that a visibility is improved.

The wiring pattern 700 may include a first wiring extension 203, a second wiring extension 206, and a third wiring extension 208. In example embodiments, the second wiring extension 206 may be disposed in the sub-pixel region II and the opaque region IV on the gate insulation layer 150. The second wiring extension 206 may be located at the same level with the first and second gate electrodes 170 and 175, and the second wiring extension 206 and the first and second gate electrodes 170 and 175 may be simultaneously formed using the same materials. Each of the second wiring extension 206 the first and second gate electrodes 170 and 175 may include a metal, a metal alloy, a metal nitride, a conductive metal oxide, transparent conductive materials, etc.

The first wiring extension 203 and the third wiring extension 208 may be disposed on the first insulating interlayer 190. The first wiring extension 203 and the third wiring extension 208 may be integrally formed. The third wiring extension 208 may overlap at least a portion of the second wiring extension 206 in the opaque region IV. The third wiring extension 208 may be in contact with the second wiring extension 206 by perforating a contact hole formed by removing at least a portion of the first insulating interlayer 190 in the overlapped portion. The first wiring extension 203, the third wiring extension 208, and the conductive pattern 180 may be disposed at the same level, and may be simultaneously formed using the same materials. Alternatively, the first wiring extension 203 and the third wiring extension 208 may be disposed at the same level with the first and second active layers 130 and 135, and the first and third wiring extensions 203 and 208 and the first and second active layers 130 and 135 may be simultaneously formed using the same materials. In some example embodiments, the first and third wiring extensions 203 and 208, the first and second source electrodes 210 and 215, and the first and second drain electrodes 230 and 235 may be disposed at the same level, and may be simultaneously formed using the same materials. Each of the first wiring extension 203, the third wiring extension 208, and the conductive pattern 180 may include a metal, a metal alloy, a metal nitride, a conductive metal oxide, transparent conductive materials, etc. Alternatively, the second wiring extension 206 may be only disposed in the opaque region IV.

Figure 15:
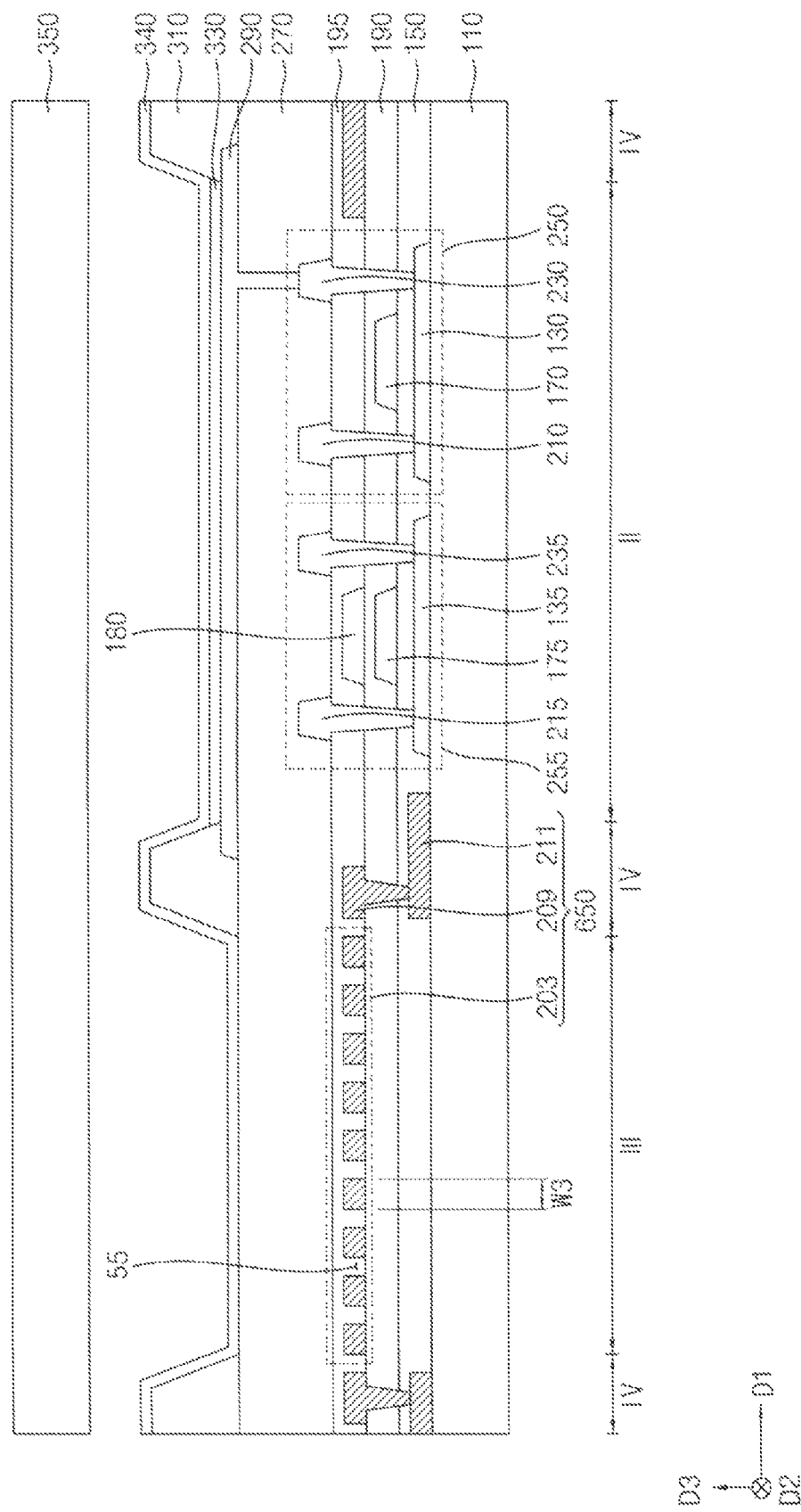
FIG. 15 is a cross-sectional view illustrating the OLED display device in accordance with some example embodiments.

FIG. 15 is a cross-sectional view illustrating the OLED display device in accordance with some example embodiments. An OLED display device illustrated in FIG. 15 may have a configuration substantially the same as or similar to that of an OLED display device 100 described with reference to FIG. 3A except a wiring pattern 650. In FIG. 15, detailed descriptions for elements, which are substantially the same as or similar to the elements described with reference to FIG. 3A, will be omitted.

Referring to FIG. 15, an OLED display device may include a substrate 110, a gate insulating layer 150, a first insulating interlayer 190, a second insulating interlayer 195, a planarization layer 270, a first semiconductor element 250, a second semiconductor element 255, the wiring pattern 650, a pixel structure, a pixel defining layer 310, an encapsulation substrate 350, etc. Here, the pixel structure may include a lower electrode 290, a light emitting layer 330, and an upper electrode 340, and the first semiconductor element 250 may include a first active layer 130, a first gate electrode 170, a first source electrode 210, and a first drain electrode 230. In addition, the second semiconductor element 255 may include a second active layer 135, a second gate electrode 175, a conductive pattern 180, a second source electrode 215, and a second drain electrode 235.

In example embodiments, the wiring pattern 650 may be disposed in a transparent region III, an opaque region IV, and a sub-pixel region II. The wiring pattern 650 may be electrically connected to the first semiconductor element 250 and/or the second semiconductor element 255.

The wiring pattern 650 may include a first wiring extension 203, a second wiring extension 211, and a third wiring extension 209. In example embodiments, the second wiring extension 211 may be disposed may be located at the same level with the first and second active layers 130 and 135, and the second wiring extension 211 and the first and second active layers 130 and 135 may be simultaneously formed using the same materials. Each of the second wiring extension 211 the first and second active layers 130 and 135 may be formed of an oxide semiconductor, an inorganic semiconductor (e.g., amorphous silicon, polysilicon, etc.), an organic semiconductor, etc. After the second wiring extension 211 and the first and second active layers 130 and 135 are formed, the second wiring extension 211 and source and drain regions of the first and second active layers 130 and 135 each may serve as a metal by performing an impurity implantation process.

The first wiring extension 203 and the third wiring extension 209 may be disposed on the first insulating interlayer 190. The first wiring extension 203 and the third wiring extension 209 may be integrally formed. The third wiring extension 209 may overlap at least a portion of the second wiring extension 211 in the opaque region IV. The third wiring extension 209 may be in contact with the second wiring extension 211 by perforating a contact hole formed by removing at least a portion of the first insulating interlayer 190 and the gate insulation layer 150 in the overlapped portion. The first wiring extension 203, the third wiring extension 209, the conductive pattern 180 may be disposed at the same level, and may be simultaneously formed using the same materials. Alternatively, the first wiring extension 203 and the third wiring extension 209 may be disposed at the same level with the first and second gate electrodes 170 and 175, and the first and third wiring extensions 203 and 209 and the first and second gate electrodes 170 and 175 may be simultaneously formed using the same materials. In some example embodiments, the first and third wiring extensions 203 and 209, the first and second source electrodes 210 and 215, and the first and second drain electrodes 230 and 235 may be disposed at the same level, and may be simultaneously formed using the same materials. Each of the first wiring extension 203, the third wiring extension 209, and the conductive pattern 180 may include a metal, a metal alloy, a metal nitride, a conductive metal oxide, transparent conductive materials, etc. Alternatively, the second wiring extension 211 may be only disposed in the opaque region IV.

FIG. 16 is a planar view illustrating the OLED display device in accordance with example embodiments. An OLED display device illustrated in FIG. 16 may have a configuration substantially the same as or similar to that of an OLED display device described with reference to FIG. 1. In FIG. 16, detailed descriptions for elements, which are substantially the same as or similar to the elements described with reference to FIG. 1, will be omitted.

Referring to FIG. 16, an OLED display device may include a plurality of pixel regions 10. One pixel region 10 among a plurality of pixel regions may include first, second, and third sub-pixel regions 15, 20, and 25, a portion of a transparent region 30, and a portion of an opaque region 35. For example, the pixel regions 10 may be arranged in first and second directions D1 and D2 on the entire substrate included in the OLED display device. Here, the first direction D1 is a row direction, and the second direction D2 is a column direction. In example embodiments, the transparent region 30 included in the pixel regions 10 arranged in the first direction D1 among the pixel regions 10 may extend in the first direction D1 on the substrate, and may have a planar shape of a bar extending in the first direction D1. For example, the pixel regions 10 arranged in the first direction D1 among the pixel regions 10 may be corresponding to one transparent region 30.

In addition, the opaque region 35 may surround the first, second, and third sub-pixel regions 15, 20, and 25, and may extend in the first direction D1. For example, the first, second, and third sub-pixel regions 15, 20, and 25 repeatedly arranged in the first direction D1 among the first, second, and third sub-pixel regions 15, 20, and 25 may be corresponding to one opaque region 35, and the opaque region 35 may not overlap the first, second, and third sub-pixel regions 15, 20, and 25 and the transparent region 30.

First, second, and third sub-pixels may be disposed in the first, second, and third sub-pixel regions 15, 20, and 25, respectively. For example, the first sub-pixel may emit a red color of a light, and the second sub-pixel may emit a green color of a light. In addition, the third sub-pixel may emit a blue color of a light. The first, second, and third sub-pixels may be disposed at the same level on the substrate.

In the transparent region 30, a light incident from the outside may be transmitted via the transparent region 30.

In the opaque region 35, a pixel defining layer included in the OLED display device may be disposed. For example, the first, second, and third sub-pixel regions 15, 20, and 25 may be substantially surrounded by the pixel defining layer. That is, the first, second, and third sub-pixel regions 15, 20, and 25 may be defined by the pixel defining layer, and the pixel defining layer may expose the first, second, and third sub-pixel regions 15, 20, and 25 and the transparent region 30. The pixel defining layer may surround the first, second, and third sub-pixel regions 15, 20, and 25, and may extend in the first direction D1. In addition, the pixel defining layer may have a planar shape of a bar extending in the first direction D1. In other word, the pixel defining layer may be disposed in a portion except the first, second, and third sub-pixel regions 15, 20, and 25 and the transparent region 30. Alternatively, the pixel defining layer may expose the first, second, and third sub-pixel regions 15, 20, and 25, and may be disposed in the transparent region 30.

In example embodiments, a wiring pattern 200 may be disposed in the first, second, and third sub-pixel regions 15, 20, and 25, the transparent region 30, and the opaque region 35 on the substrate. For example, the wiring pattern 200 may be disposed in the pixel regions 10 arranged in the second direction D2 among the pixel regions 10. In other word, the wiring pattern 200 may extend in the second direction D2 on the substrate. In addition, the wiring pattern 200 may have a first width in the transparent region 30, and may have a second width in the first, second, and third sub-pixel regions 15, 20, and 25 and the opaque region 35. Here, the second width may be less than the first width.

The wiring pattern 200 may be metal or conductive wirings (e.g., a power supply voltage wiring, a scan signal wiring, a data signal wiring, an emission signal wiring, etc). For example, the wiring pattern 200 may be the emission signal wiring, and may provide the emission signal to at least one semiconductor element included in the OLED display device. Compared to a conventional OLED display device, the conductive wirings included in the conventional OLED display device may be disposed under the pixel defining layer surrounding the transparent region 30, and a portion surrounding the transparent region 30 may be opaque because the conductive wirings are opaque. Thus, a diffraction phenomenon of a light transmitting the transparent region 30 may be generated in the conventional OLED display device due to the opaque portion. As the OLED display device in accordance with example embodiments includes the wiring pattern 200, the opaque portion surrounding the transparent region 30 (e.g., an opaque portion perforating the transparent region 30 in the second direction D2) may be removed. Accordingly, a visibility of the OLED display device may be improved. In addition, the wiring pattern 200 may have at least one opening in the transparent region 30, and a light incident from the outside may be transmitted via the opening. For example, although the wiring pattern 200 is disposed in the transparent region 30, an image of an object that is located at the back of the OLED display device may be transmitted via the opening. Accordingly, the OLED display device may serve as a transparent OLED display device.

In example embodiments, three wiring patterns 200 may be disposed in one pixel region 10, but not being limited thereto.

The present application may be applied to various display devices including an organic light emitting diode display device. For example, the present application may be applied to vehicle-display device, a ship-display device, an aircraft-display device, portable communication devices, display devices for display or for information transfer, a medical-display device, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and features of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An organic light emitting diode (OLED) display device, comprising:
a substrate including a plurality of pixel regions each having sub-pixel regions and a transparent region;
a pixel structure in the sub-pixel region on the substrate; and
a wiring pattern in the transparent region and the sub-pixel region on the substrate, the wiring pattern being electrically connected to the pixel structure, the wiring pattern continuously extending in the pixel regions along a first direction, the wiring having at least one opening in the transparent region, wherein the substrate further includes an opaque region surrounding the sub-pixel region, wherein the opaque region does not overlap the sub-pixel region and the transparent region, wherein the wiring pattern includes:
a first wiring extension extending along the first direction in the transparent region, the first wiring extension having a mesh structure including a plurality of openings; and
a second wiring extension extending along the first direction in the sub-pixel region and the opaque region.

2. The OLED display device of claim 1, wherein the wiring pattern extends in the first direction from the transparent region into the sub-pixel region.

3. The OLED display device of claim 1, wherein the wiring pattern has a first width in the transparent region and a second width in the sub-pixel region that is less than the first width.

4. The OLED display device of claim 1, wherein the pixel regions are arranged on the entire substrate in the first direction and a second direction that is perpendicular to the first direction, and
wherein the transparent region included in the pixel regions arranged in the second direction among the pixel regions extends in the second direction on the substrate, and has a planar shape of a bar extending in the second direction.

5. The OLED display device of claim 1, wherein the pixel regions are arranged on the entire substrate in the first direction and a second direction that is perpendicular to the first direction, and
wherein the pixel regions arranged in the second direction among the pixel regions are corresponding to one transparent region.

6. The OLED display device of claim 1, wherein the pixel regions are arranged on the entire substrate in the first direction and a second direction that is perpendicular to the first direction, and
wherein the wiring pattern is disposed in the pixel regions arranged in the first direction among the pixel regions.

7. The OLED display device of claim 1, wherein the wiring pattern has a plurality of openings in the transparent region, and is spatially divided by the openings.

8. The OLED display device of claim 7, wherein the openings are regularly arranged.

9. The OLED display device of claim 7, wherein the openings are irregularly arranged.

10. The OLED display device of claim 7, wherein a shape of the openings each has a planar shape of a tetragonal opening, triangle opening, a diamond opening, a polygonal opening, a circular opening, an athletic track opening, or an elliptical opening.

11. The OLED display device of claim 1,
wherein the OLED display device further comprises:
a pixel defining layer in the opaque region, the pixel defining layer exposing the sub-pixel regions and the transparent region,
wherein the pixel defining layer surrounds the sub-pixel region, and extends in a second direction that is perpendicular to the first direction, and
wherein the pixel defining layer has a planar shape of a bar extending in the second direction.

12. The OLED display device of claim 11, wherein the first and second wiring extensions are integrally formed.

13. The OLED display device of claim 12, wherein the wiring pattern further includes:
a third wiring extension interposed between the first and second wiring extensions, the third wiring extension extending along the first direction in the opaque region, the third wiring extension having a width that is greater than a width of a second wiring extension.

14. The OLED display device of claim 13, wherein a first side of the third wiring extension is in contact with the first wiring extension, and a second side of the third wiring extension is in contact with the second wiring extension, and
wherein the first, second, and third wiring extensions are integrally formed.

15. The OLED display device of claim 13, wherein the pixel defining layer has an opaque color, and the third wiring extension is disposed under the pixel defining layer.

16. The OLED display device of claim 13, further comprising:
a semiconductor element in the sub-pixel region on the substrate, the semiconductor element being electrically connected to the pixel structure,
wherein the semiconductor element includes:
an active layer on the substrate, the active layer including source and drain regions;
a gate electrode on the active layer;
a conductive pattern on the gate electrode;
a source electrode on the conductive pattern, the source electrode being in contact with the source region of the active layer; and
a drain electrode spaced apart from the source electrode, the drain electrode being in contact with the drain region of the active layer.

17. The OLED display device of claim 16, wherein the wiring pattern and the conductive pattern are located at the same level, and the wiring pattern and the conductive pattern are simultaneously formed using the same materials.

18. The OLED display device of claim 11, further comprising:
a third wiring extension extending along the first direction in the opaque region, the third wiring extension having a width that is greater than a width of a second wiring extension,
wherein the first wiring extension disposed in the transparent region and the third wiring extension disposed in the opaque region are integrally formed, and the first and third wiring extensions are disposed on the second wiring extension disposed in the sub-pixel region.

19. The OLED display device of claim 18, wherein the third wiring extension overlaps at least a portion of the second wiring extension, and is in contact with the second wiring extension through a contact hole located in the overlapped portion.

* * * * *